United States Patent [19]
Tomita

[11] Patent Number: 5,881,009
[45] Date of Patent: Mar. 9, 1999

[54] SEMICONDUCTOR MEMORY DEVICE

[75] Inventor: Hiroyoshi Tomita, Kawasaki, Japan

[73] Assignee: Fujitsu Limited, Kawasaki, Japan

[21] Appl. No.: 1,655

[22] Filed: Dec. 31, 1997

[30] Foreign Application Priority Data

Jun. 4, 1997 [JP] Japan ................................. 9-146942

[51] Int. Cl.[6] .................................................. G11C 7/00
[52] U.S. Cl. ................ 365/221; 365/230.04; 365/230.08
[58] Field of Search .............................. 365/221, 230.03, 365/230.04, 230.08

[56] References Cited

U.S. PATENT DOCUMENTS

| 5,453,957 | 9/1995 | Norris et al. | 365/230.04 |
| 5,787,047 | 7/1998 | Norris et al. | 365/230.04 |

*Primary Examiner*—Vu A. Le
*Attorney, Agent, or Firm*—Nikaido, Marmelstein, Murray & Oram LLP

[57] ABSTRACT

In the present invention data from the odd memory cell array is latched to a data-hold circuit at a fast timing, which ignores the delay time of the +1 arithmetic circuit, and outputs that data to the output terminal. Further, when the supplied column address is even, data from the even memory cell array is latched to a data-hold circuit at a fast timing similar to that described above, and when the column address is odd, this data is latched to a data-hold circuit with a delay equivalent to the delay of the +1 arithmetic circuit. In this case, since the output of even output data to an output terminal occurs following the output of odd output data, the overall output operation is not affected comparing to the conventional one. Another aspect of the present invention provides a circuit, which shifts one bit combinations of the second and third bits following the least significant bit in a column address. And when the column address is even, the second and third bits address as-is are supplied into an even decoder, and when the column address is odd, supplies a shifted combination of the second and third bits address are supplied to the even decoder. Since this shift operation does not require the same delay time as conventional arithmetic operations, both even and odd CAS delay times can be reduced.

13 Claims, 21 Drawing Sheets

2 BITS PRE-FETCH OPERATION t11: ADDRESS DECODING
t12: COLUMN SELECTION
t13: DATA BUS READ OUT
t14: OUTPUT

FIG.2

ADDRESS OF 2 BITS PRE-FETCH

| INPUT ADDRESS a2, a1, a0 | FIRST READ ADDRESS a2, a1, a0 | SECOND READ ADDRESS a2, a1, a0 |
|---|---|---|
| 0 0 0 | 0 0 0    EVEN | 0 0 1    ODD |
| 0 0 1 | 0 0 1    ODD | 0 1 0    EVEN |
| 0 1 0 | 0 1 0    EVEN | 0 1 1    ODD |
| 0 1 1 | 0 1 1    ODD | 1 0 0    EVEN |
| 1 0 0 | 1 0 0    EVEN | 1 0 1    ODD |
| 1 0 1 | 1 0 1    ODD | 1 1 0    EVEN |
| 1 1 0 | 1 1 0    EVEN | 1 1 1    ODD |
| 1 1 1 | 1 1 1    ODD | 0 0 0    EVEN |

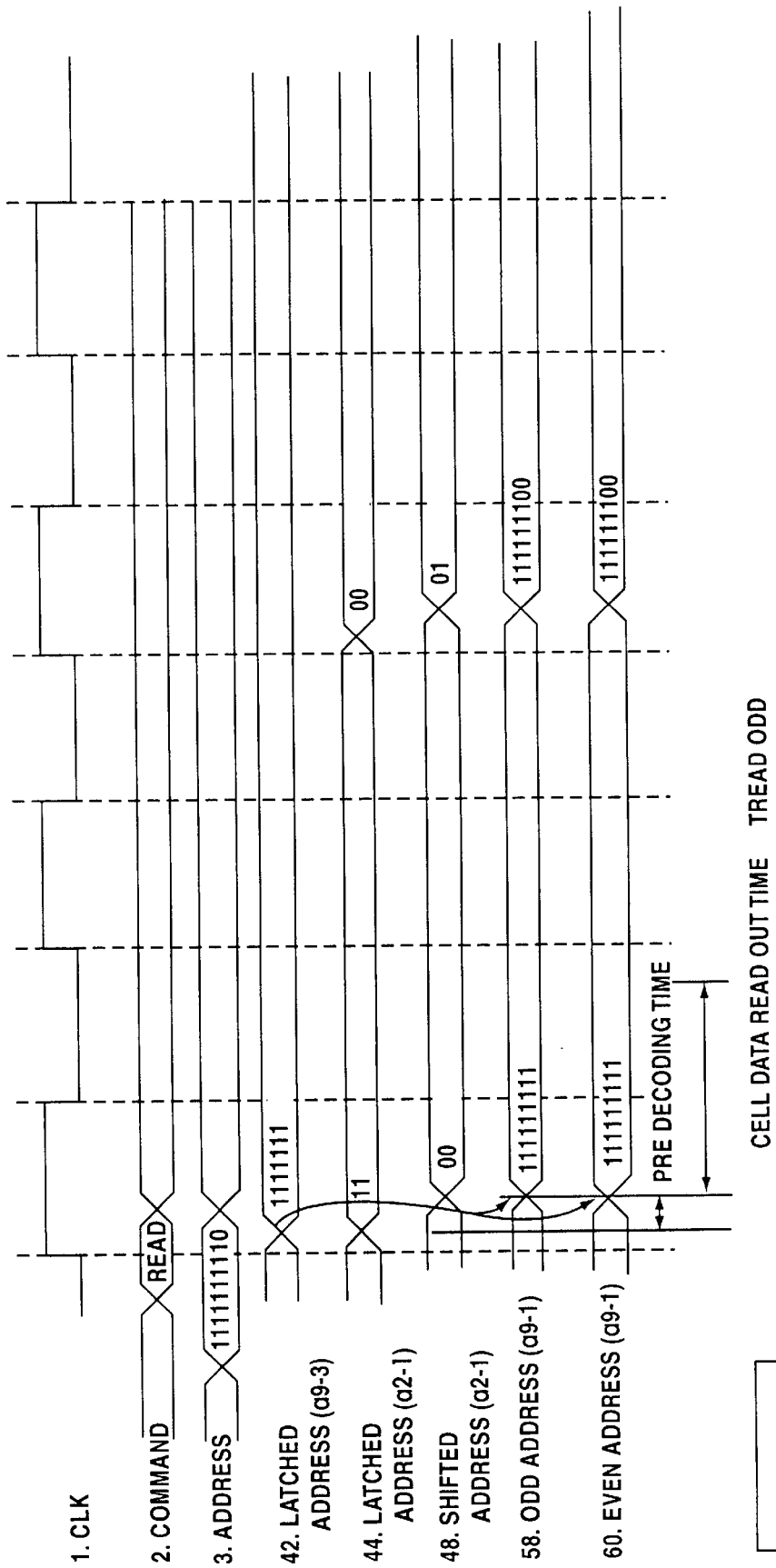
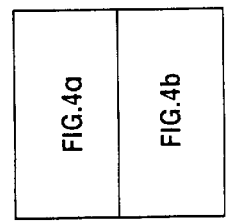
FIG.4a

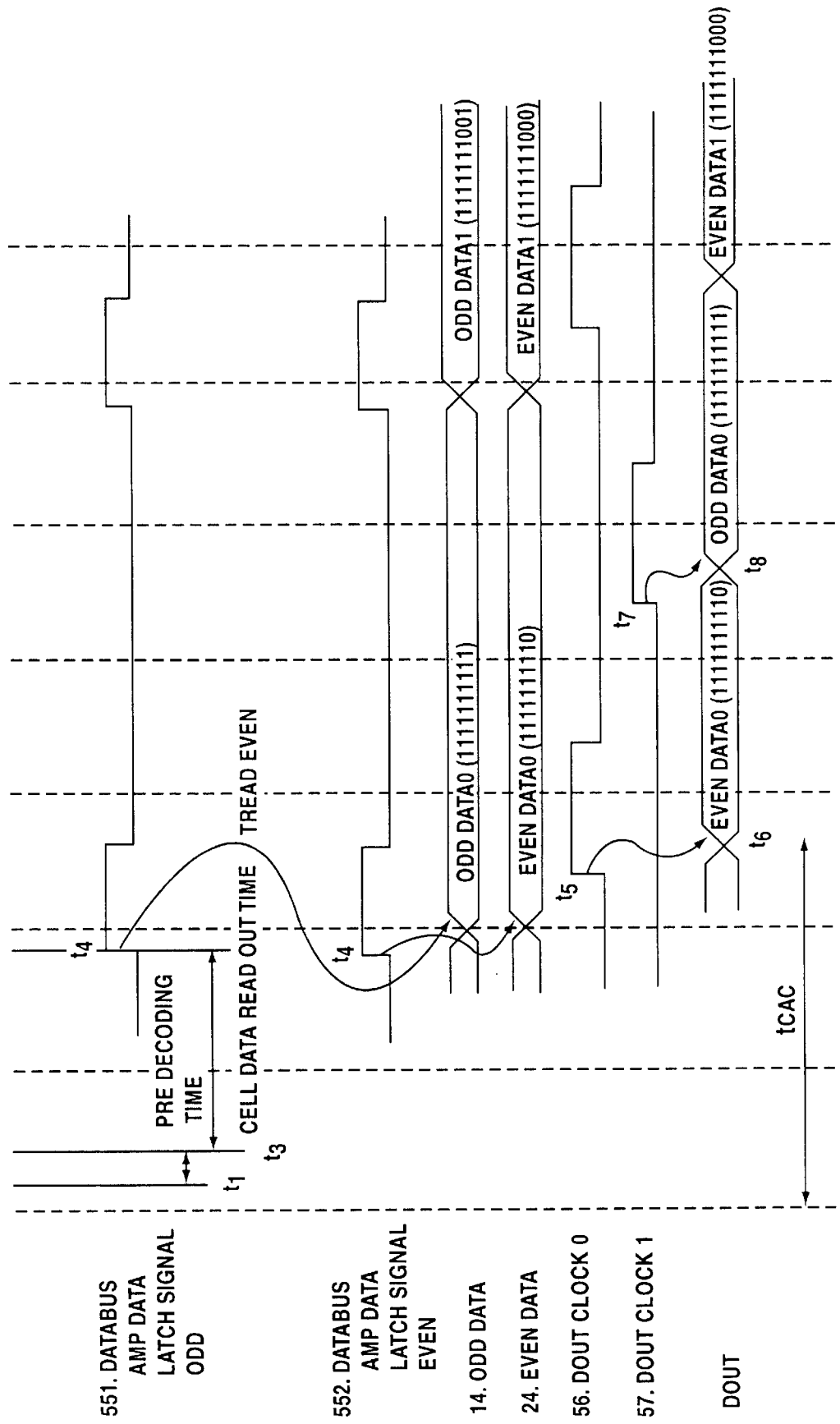

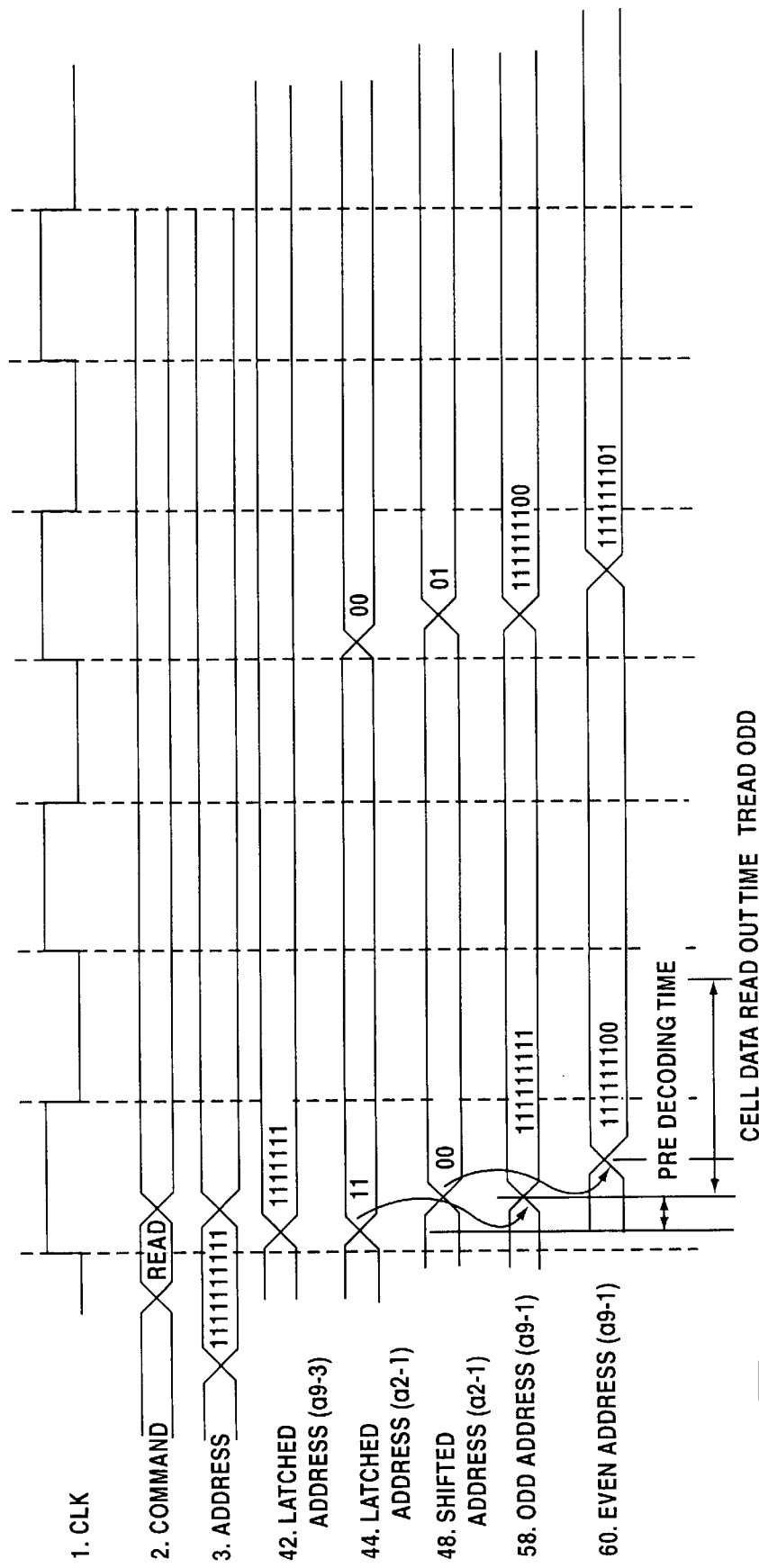

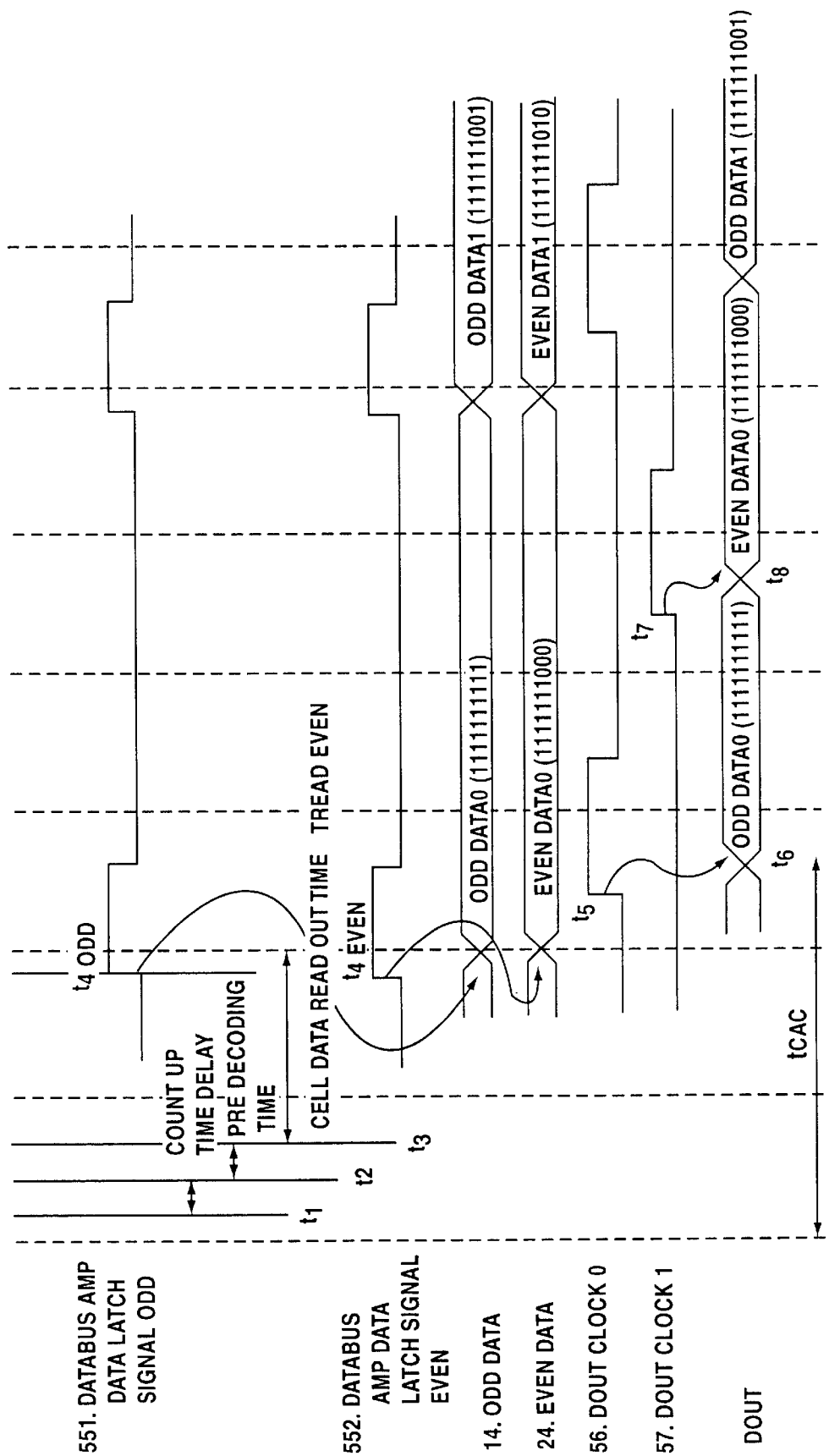

CIRCUIT EXAMPLE 501

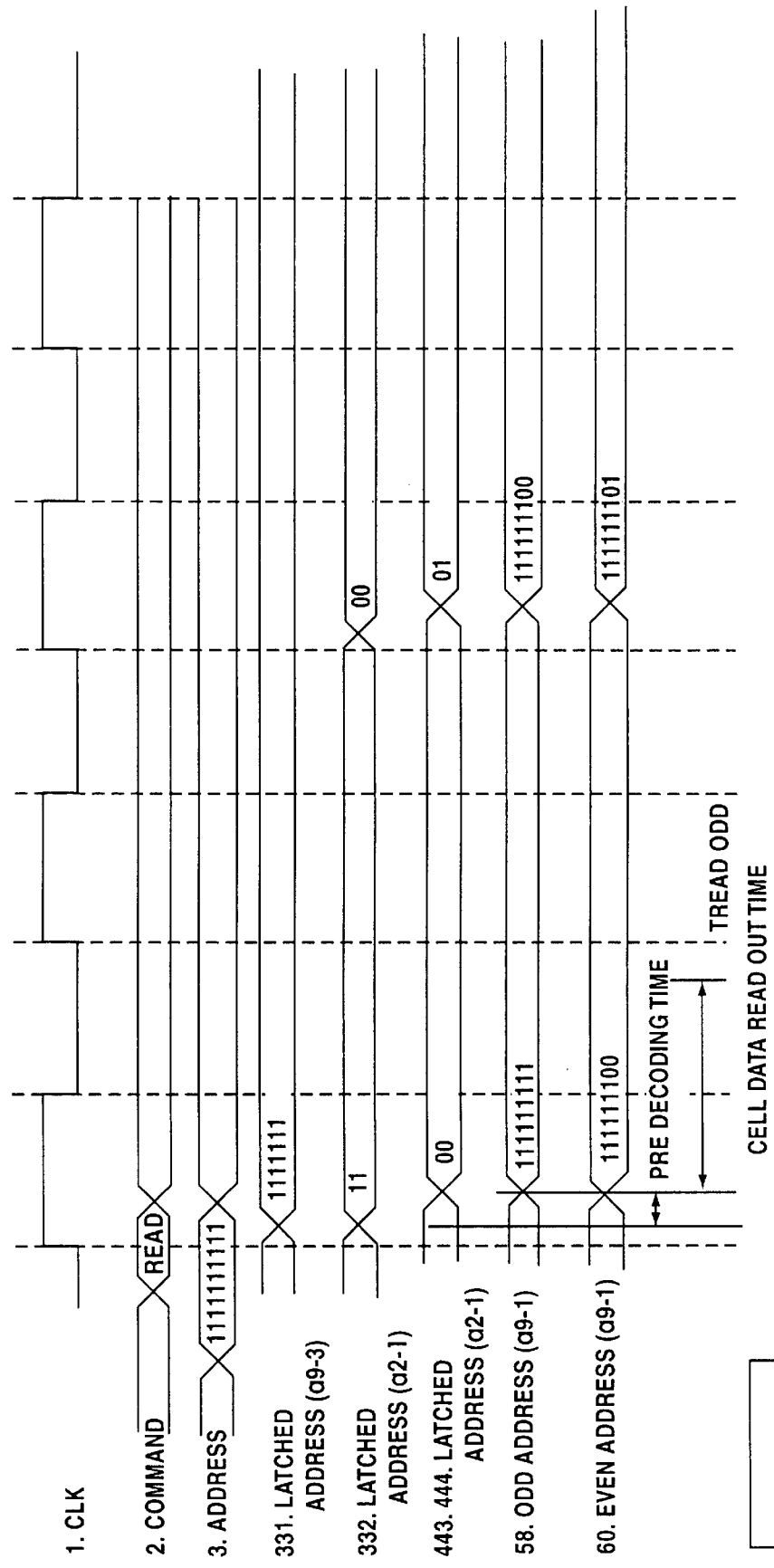

CONVERSION CIRCUIT 502

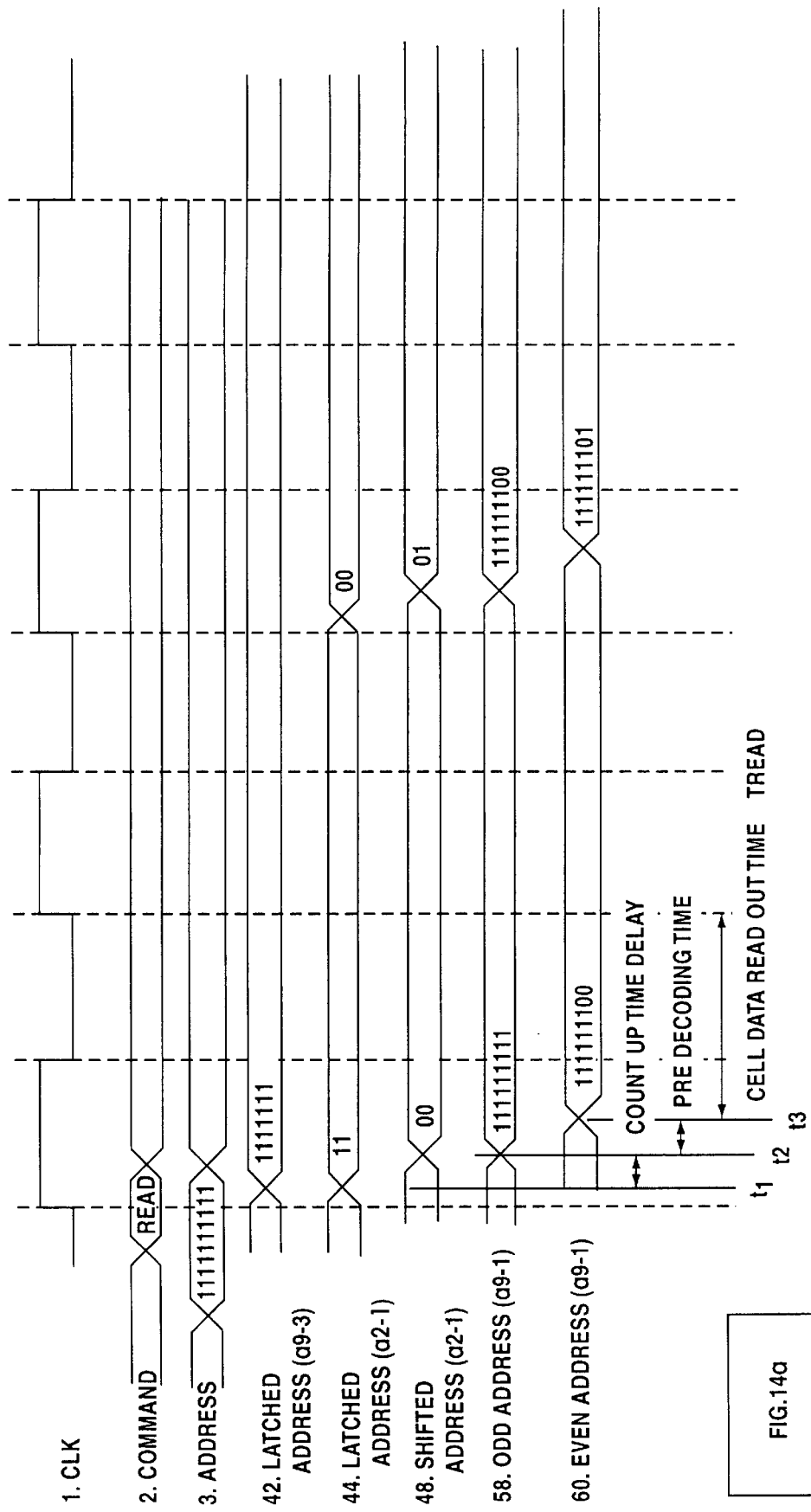

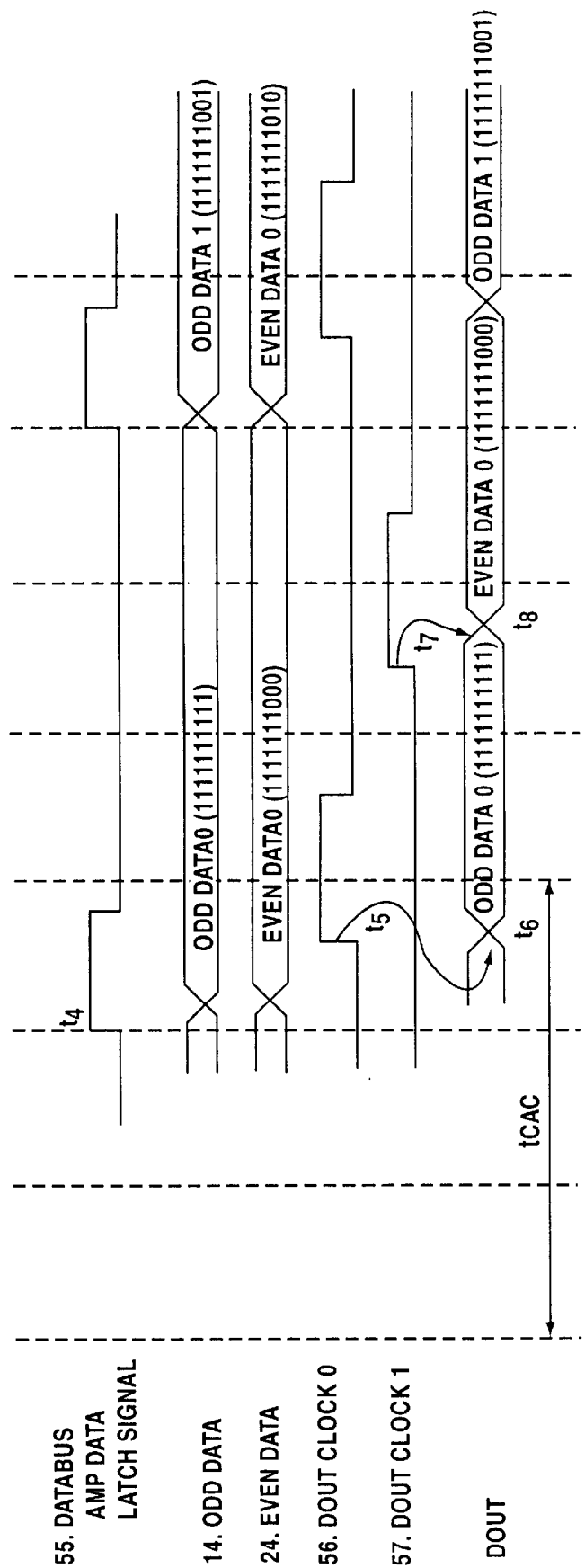

SEMICONDUCTOR MEMORY DEVICE

BACKGROUND OF THE INVENTION

1. Field of the Invention

The present invention relates to a semiconductor memory device, and more particularly to a semiconductor memory device, which improves 2-bit pre-fetch access time in a burst mode of a synchronized Dynamic Random Access Memory (SDRAM).

2. Description of the Related Art

A synchronized DRAM (hereafter referred to simply as SDRAM) is a DRAM that performs internal operations in synchronous with a system-supplied clock, and is capable of faster operation than an ordinary DRAM. This SDRAM is also supplied with system-supplied command signals, which specify operating modes. By internally decoding these supplied command signals, the SDRAM determines the system-requested operating mode, and, for example, outputs read data in accordance with a specified operating mode.

One of the aforementioned operating modes is a burst mode. Relative to an externally-supplied address, this burst mode treats that address as the point of origin and outputs memory data of consecutive addresses. It also specifies the number of consecutive output bits as 2 bits, 4 bits or 8 bits.

With such a burst mode, an SDRAM internally generates consecutive addresses based on the external address, decodes those addresses and outputs their memory data. However, it is inefficient that one internal address is generated in the 2-bit burst mode, three internal addresses are generated in the 4-bit burst mode, and seven internal addresses are generated in the 8-bit burst mode.

Accordingly, SDRAM divides the internal memory cell array into an odd address memory cell array and an even address memory cell array, and in the burst mode, for externally-supplied or internally-generated addresses, supplies addresses minus their least significant bits to column decoders in the odd address memory cell array and even address memory cell array. Such an architecture makes it possible to output 2-bit memory data sequentially at all times. This architecture is called a 2-bit pre-fetch circuit.

FIG. 13 depicts an example of a conventional SDRAM 2-bit pre-fetch circuit. In this example, the memory cell array is divided into an odd address memory cell array 10 and even address memory cell array 20. Then, address predecoders 11, 21 and address main decoders 12, 22 are provided for each of the memory cell arrays 10, 20. Furthermore, the output from each memory cell array 10, 20 is amplified by a data bus amplifier 13, 23.

SDRAM operates in synchronous with a clock CLK supplied by the system. Therefore, based on the timing of the clock 31 output from the clock buffer 30 incorporating this clock CLK, a command signal 2 (Comm) is latched by a command latch & decoder 32, and an address signal 3 (Add) (in this example, 10 bits from a0–a9) is latched by an address buffer 33. Then, an address signal a3–a9 from the address buffer 33 is latched by an address latch 38 based on the timing of an address latch clock 35 generated by the command latch & decoder 32. Also, based on the same clock 35, an address signal a1–a2 is latched by an address latch & counter 39.

An address signal a3–a9 is supplied as-is to odd and even address predecoders 11, 21. Meanwhile, address a1, a2 is supplied as-is to the odd address predecoder 11. Also, address a1, a2 is supplied to the even address predecoder in accordance with the value of the least significant ad dress a0, that is, according to whether it is odd or even, either as-is as a latched address 44 or as a new shifted address 48 which the address arithmetic circuit 46 increments by 1 the address a1, a2.

Thus, when the external address is even, the even memory data 24 amplified by the even data bus amplifier 23 is latched by an output data latch circuit 16 based on clock 56 timing, and then the odd memory data 14 amplified by the odd data bus amplifier 13 is latched by an output data latch circuit 26 based on clock 57 timing, and even and odd data are sequentially output in that order.

Further, when the external address is odd, odd memory data 14 is latched by an output data latch circuit 16, and even memory data is latched by an output data latch circuit 26, based on timing supplied by clocks 56, 57, respectively, and odd and even data are sequentially output in that order.

FIG. 14 is a timing chart depicting the operation of the circuitry depicted in the above-described FIG. 13. With SDRAM, a command signal 2 which instructs read is supplied in synchronous with the rise edge of the external clock CLK, and an external address 3 is supplied based on the same timing. Then, address 42 (a9–a3) and address 44 (a1, a2), which were latched by address latch circuits 38, 39, are output based on time t1 timing.

However, in the case of an externally-supplied odd address, a shifted address 48, which is generated by adding 1 to an address a1, a2, must be supplied to the even address predecoder 21. In the figure, this shifted address 48 is generated at time t2. As a result, even if an odd address 58 (a9–a1) is generated on the basis of time t2 timing, an even address 60 (a9–a1) is not generated until time t3. Therefore, once both addresses 58 and 60 have been generated, and following the read time tread of the cell data in the memory cell arrays 10, 20, a data bus amplifier latch signal 55 is generated by a clock generator 54 based on time t4 timing, and both data are latched by the data bus amplifiers 13, 23. Then, read data is latched by an output data latch circuit 16 on the basis of clock 56 timing, following which, read data is latched by an output data latch circuit 26 on the basis of clock 57 timing.

Therefore, CAS delay time $t_{cac}$, from the clock CLK rise timing, by which a read command 2 is supplied, until time t6, when the initial read data is output in th5 terminal Dout, is fairly long.

In addition, in a 4-bit burst mode, the above-described 2-bit pre-fetch operation is performed two times, and in an 8-bit burst mode, the above-described 2-bit pre-fetch operation is performed four times. Thus, the above-described CAS delay timetfFt$_{cac}$, is required for each 2-bit pre-fetch operation.

This kind of delay time is not suitable for burst mode read time aimed at highspeed operation, and the reduction of CAS delay time $t_{CAC}$ is desirable.

Therefore, it is an object of the present invention to provide a semiconductor memory device that speeds up the 2-bit pre-fetch operation in the burst mode.

In addition, another object of the present invention is to provide a semiconductor memory device that reduces the CAS delay time at least until the initial output data in a burst mode 2-bit pre-fetch operation is output.

SUMMARY OF THE INVENTION

In the present invention, data from the odd memory cell array is latched to a data-hold circuit at a fast timing, which ignores the delay time of the +1 arithmetic circuit, and outputs that data to the output terminal. Further, even memory cell array is latched to a data-hold circuit at a fast timing similar to that described above, and when the column address is odd, this data is latched to a data-hold circuit with a delay equivalent to the delay of the +1 arithmetic circuit. In th is case, since the output of even output data to an output terminal occurs following the output of odd output data, th e overall output operation is not affected comparing to the conventional one.

To achieve the above-describe objects, the present invention is a semiconductor memory device having a 2-bit pre-fetch function, which sequentially outputs first data of a memory cell that corresponds to an externally-supplied or internally-generated first column address, and a second data of a memory cell that corresponds to a second column address, which increments said first column address, comprising:

an odd memory cell array, comprising memory cells that correspond to odd column addresses;

an odd column address decoder that corresponds to said odd memory cell array;

an odd data-hold circuit for holding read data from said odd memory cell array;

an even memory cell array, comprising memory cells that correspond to even column addresses;

an even column address decoder that corresponds to said even memory cell array; and an even data-hold circuit for holding read data from said even memory cell array;

wherein when the least significant bit in said first column address is odd, hold timing of said odd data-hold circuit is faster than hold timing of said even data-hold circuit.

Another aspect of the present invention provides a circuit, which shifts one bit combinations of the second and third bits following the least significant bit in a column address. And when the column address is even, the second and third bits address as-is are supplied into an even decoder, and when the column address is odd, a shifted combination of the second and third bits address are supplied to the even decoder. Since this shift operation does not require the same delay time as conventional arithmetic operations, both even and odd CAS delay times can be reduced.

A further aspect that achieves the above-described objects, is a semiconductor memory device having a 2-bit pre-fetch function, which sequentially outputs first data of a memory cell that corresponds to an externally-supplied or internally-generated first column address, and a second data of a memory cell that corresponds to a second column address which increments said first column address, comprising:

an odd memory cell array, comprising memory cells that correspond to odd column addresses;

an odd column address decoder that corresponds to said odd memory cell array;

an odd data-hold circuit for holding read data from said odd memory cell array;

an odd even memory cell array, comprising memory cells that correspond to even column addresses;

an even column address decoder that corresponds to said even memory cell array;

an even data-hold circuit for holding read data from said even memory cell array;

a predecoder for predecoding at least the two lower bits of said first column address;

an odd address latch circuit for latching said predecoded signal and supplying the predecoded signal to said odd decoder; and an even address latch circuit for latching a predecoded first signal when said first column address is even, for latching second signal, which predecodes an address incremented at least said two lower bits when said first column address is odd, and for supplying said first or second signals to said even decoder.

Yet another aspect that achieves the above-described objects is a semiconductor memory device having a 2-bit pre-fetch function, which sequentially outputs first data of a memory cell that corresponds to an externally-supplied or internally-generated first column address, and a second data of a memory cell that corresponds to a second column address which increments said first column address, comprising:

an odd memory cell array, comprising memory cells that correspond to odd column addresses;

an odd column address decoder that corresponds to said odd memory cell array;

an odd data-hold circuit for holding read data from said odd memory cell array;

an even memory cell array, comprising memory to cells that correspond to even column addresses;

an even column address decoder that corresponds to said even memory cell array;

an even data-hold circuit for holding read data from said even memory cell array;

an address latch including an odd address latch circuit for latching a first signal predecoded at least the lower two bits of said first column address, and for supplying the first signal to said odd decoder; and an even address latch circuit for latching said first signal when said first column address is even, for latching a second signal shifted from said first signal said first column address is odd, and supplies said first or second signals to said even decoder.

BRIEF DESCRIPTION OF THE DRAWINGS

FIG. 2 provides a table listing the column addresses in a 2-bit pre-fetch operation;

FIG. 4 depicts a timing chart showing the operation of the circuitry of the embodiment depicted in FIG. 3 when an even address is supplied;

FIG. 5 depicts a timing chart showing the operation of the circuitry of the embodiment depicted in FIG. 3 when an odd address is supplied;

DESCRIPTION OF THE PREFERRED EMBODIMENTS

The following explains examplifierles of embodiments of the present invention in accordance with figures. However, such embodiments do not limit the scope of the present invention.

Figure 1:
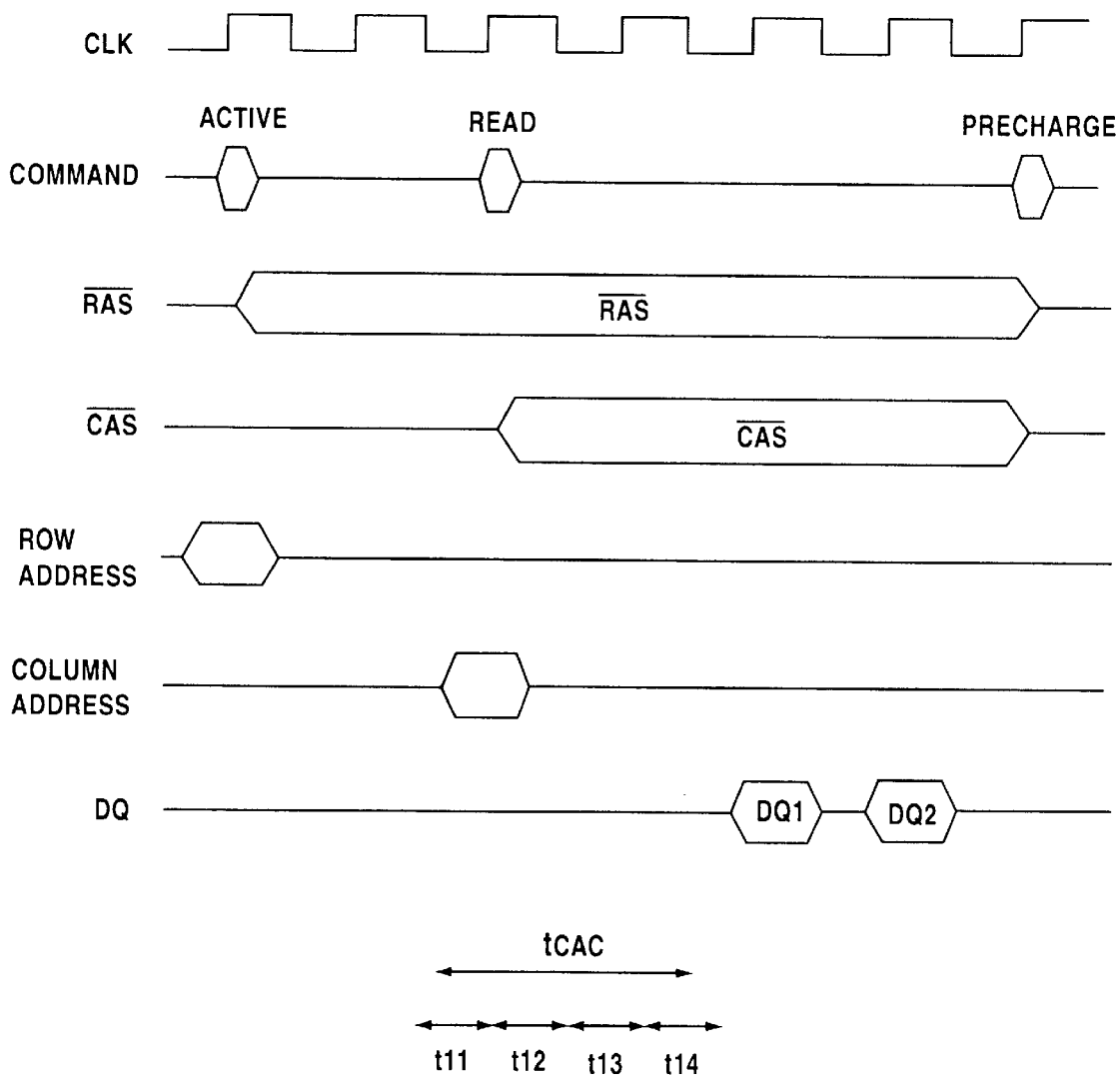
FIG. 1 depicts a timing chart for explaining a 2-bit pre-fetch operation.

FIG. 1 is a diagram depicting a timing chart for explaining a 2-bit pre-fetch operation. All memory operations, including row and column operations, are depicted in FIG. 1. With an SDRAM, command signals 2, row addresses 4, column addresses 3 and other data are supplied from outside in synchronous with an external clock 1. In the 2-bit burst mode read operation depicted in FIG. 1, initially, an active command and row address 4 are supplied in synchronous with the rise edge of the clock 1. Therefore, a word line is selected thereafter and driven at the H level. This state is indicated by /RAS (or RAS bar).

Then, a read command (read command) and column address 3 are supplied in synchronous with the rise edge of the clock 1. Subsequently, after column address decoding t11, bit line selection t12, reading of data read out on a data bus t13 and outputting of read data from an output data latch t14, two data are sequentially output to the output terminal Dout. The above-described times t11–t14 are the column CAS delay time $t_{cac}$.

During the period when the column is in an active state as indicated by /CAS, the column circuits, such as the data bus line and data bus amplifier, can only take one state. However, by opting for this 2-bit pre-fetch architecture, memory data of two consecutive addresses can be read for each column address with respect to a single column address, and overall access time can be reduced.

FIG. 2 is a table listing the column addresses in a 2-bit pre-fetch operation. For each column address supplied, a 2-bit pre-fetch circuit sequentially outputs the column memory data of that address and the column memory data of the address subsequent to that address. Therefore, the 2-bit pre-fetch circuit must generate the address subsequent to a supplied column address.

In FIG. 2, the left column lists the supplied input address a2, a1, a0, the center column lists the first read address a2, a1, a0, and the right column lists the second read address a2, a1, a0. A supplied input address can be an externally-supplied address or an internally-generated address.

If we assume that the supplied address is (a2, a1, a0)=(0, 0, 0), the first address is the same as that (0, 0, 0), and the second address becomes (0, 0, 1). Therefore, the data initially read out is even memory cell array data, and the data read out subsequent to that is odd memory cell array data. In this case, (a2, a1)=(0, 0) can be supplied to both the odd decoder and the even decoder.

Similarly, if we make the supplied address (a2, a1, a0)=(0, 0, 1), the first address is the same as that (0, 0, 1), and the second address becomes (0, 1, 0). Accordingly, the data initially read out is odd memory cell array data, and the data read out subsequent to that is even memory cell array data. In this case, (a2, a1)=(0, 0) must be supplied to the odd decoder, and (a2, a1)=(0, 1) must be supplied to the even decoder.

Furthermore, if we make the supplied address (a2, a1, a0)=(0, 1, 1), the first address is the same as that (0, 1, 1), and the second address becomes (1, 0, 0). Accordingly, the data initially read out is odd memory cell array data, and the data read out subsequent to that is even memory cell array data. In this case, (a2, a1)=(0, 1) must be supplied to the odd decoder, and (a2, a1)=(1, 0) must be supplied to the even decoder.

As is clear from the above explanation, when the supplied address is an even address, consecutive address data can be read by supplying column addresses excluding their least significant bits to the even decoder and odd decoder. Conversely, when the supplied address is odd, a new column address (a2, a1), which adds +1 to the column address (a2, a1) must be generated to the even decoder. Moreover, a carry operation may be necessary, as in the case of a +1 arithmetic operation in which (a2, a1)=(0, 1).

Figure 13:
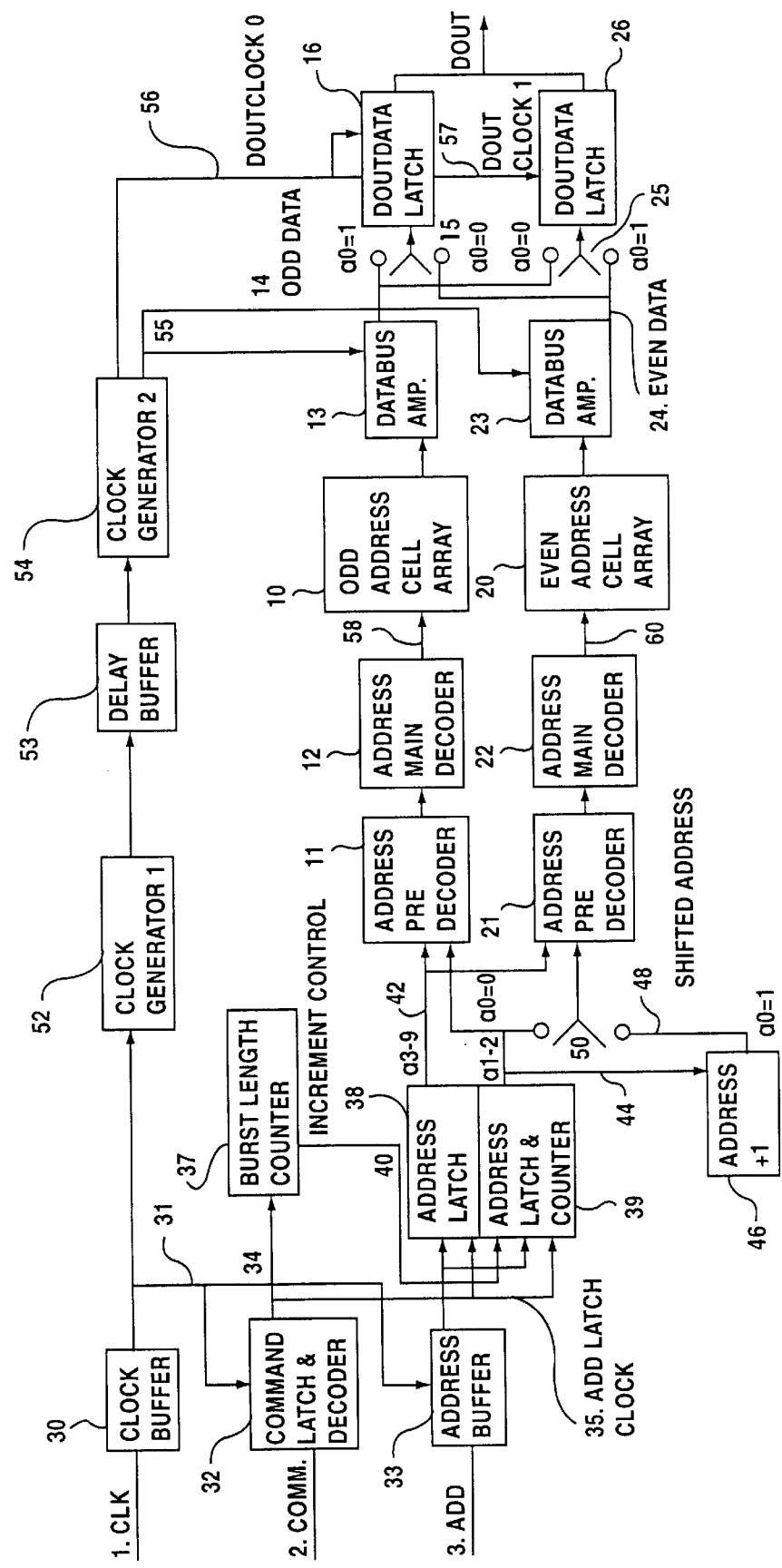
FIG. 13 depicts an example of a conventional SDRAM 2-bit pre-fetch circuit.
Figure 14B:
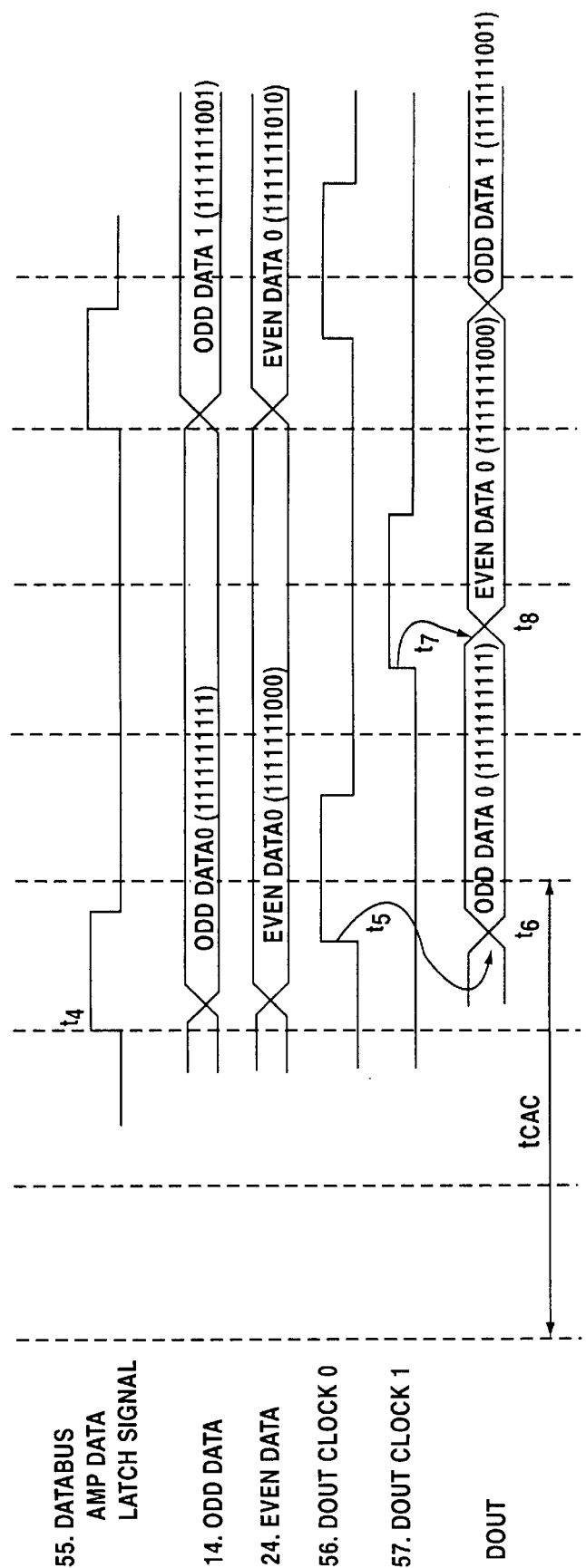
FIG. 14 depicts a timing chart showing the operation of the circuitry depicted in FIG. 13.

In above-described FIG. 13, which depicts a conventional examplifierle of a SDRAM, a shifted address 48, which underwent +1 processing in a +1 arithmetic circuit, is generated relative to a supplied column address, and depending on whether the least significant bit a0 of the column address is 0 (even address) or 1 (odd address), the SDRAM switches the column address a2, a1 supplied to the even decoder. Similarly, the latching order of data bus amplifier 13, 23 output to the output data latch circuits 16, 26 on the output side is also switched depending on whether the least significant bit is a 0 or a 1.

Figure 3:
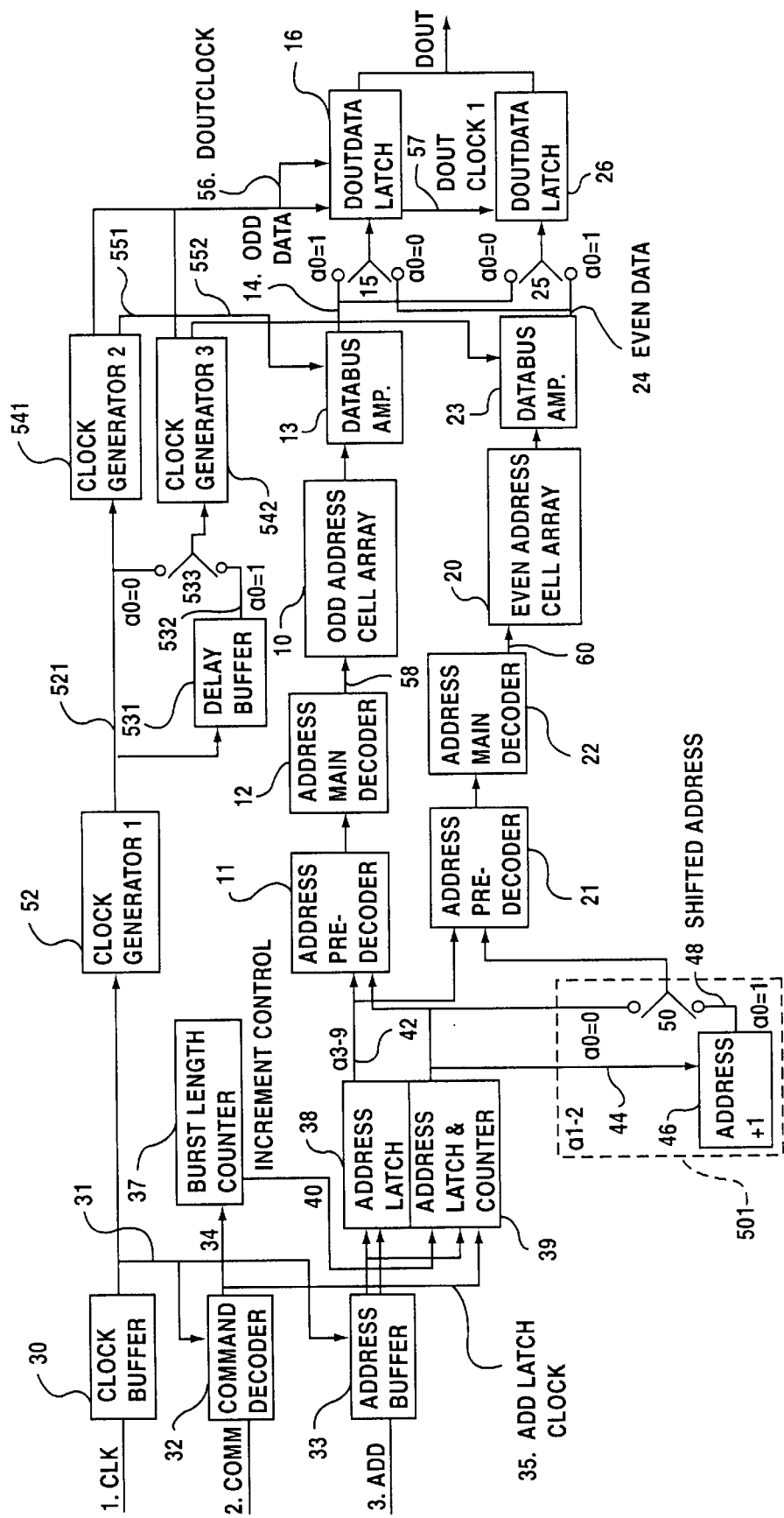
FIG. 3 depicts a 2-bit pre-fetch circuit, which is an embodiment of the present invention.

FIG. 3 is a diagram depicting a 2-bit pre-fetch circuit that is an embodiment of the present invention. In FIG. 3, the same reference numbers are attached to those parts which correspond to FIG. 13. With the circuit depicted in FIG. 3, the process wherein a command 2 and address 3 are introduced to respective buffers 32, 33 on the basis of clock 1 timing, address a9–a3 is latched by an address latch 38 and address a2–a1 is latched by an address latch & counter 39 is similar to that of the circuit depicted in FIG. 13. Further, the fact that read data from the respective memory cell arrays 10, 20 are latched by the corresponding data bus amplifiers 13, 23, which are data-hold circuits, and the data are latched by corresponding output data latches 16, 26 depending on an even address (a0=0) or an odd address (a0=1), is also similar to the circuit in the FIG. 13.

This embodiment differs from the conventional example depicted in FIG. 13 in that the data bus amplifier & data latch signals 551, 552, which supply latch timing to the data bus amplifiers 13, 23, are generated separately by the second and third clock generators 541, 542. Moreover, with this embodiment, when an even address (a0=0) is supplied, the second and third clock generators 541, 542 generate data latch signals 551, 552 based on the fast timing of clock 521 generated from the first clock generator 52. Then, when an odd address (a0=1) is supplied, the second clock generator 541 generates an odd data latch signal 551 based on the fast timing of clock 521 generated from the first clock generator 52, and the third clock generator 542 generates an even data latch signal 552 based on a delayed timing clock 532 generated by a delay buffer 531. The fast timing clock 521 and the delayed timing clock 532 are supplied to the third clock generator 542 via a switch 533 that switches between the two timing clocks in accordance to whether the least significant bit a0 is a 0 or a 1.

That is, when an even address is supplied, since the shifted address 48 of the address a2, a1 generated by the +1 arithmetic circuit 46 is not necessary, the data from the even and odd memory cell arrays 10, 20 is latched by the data bus amplifiers 13, 23 at a fast timing without considering the operational time of the arithmetic circuit Conversely, when an odd address is supplied, the odd address predecoder 11 receives the supplied address a9–a3 as-is and decodes it, and the output data from the odd memory c ell array 10 is latched at a fast timing by the data bus amplifier 13 that is the odd data-hold circuit. Therefore, the odd output data which should be output initially is generated by the output terminal Dout without waiting the time it takes for the arithmetic circuit 46 to operate. Then, the even address predecoder 21 receives and decodes a shifted address 48 generated by the arithmetic circuit 46 by adding +1, and the output data from the even memory cell array 20 is latched by data bus amplifier 23 at the delayed timing. However, because the even data is output to the output terminal Dout after the odd data output, even if the latch timing of the even data bus amplifier 23 is delayed, it does not impact overall access time.

FIG. 4 is a timing chart depicting the operation of the circuit of the embodiment depicted in FIG. 3 when an even address is supplied. When an externally-supplied or internally-generated even address is supplied, as explained with reference to the address table shown in FIG. 2, the address a1–a9 can simply be supplied to both address predecoders 11, 21 by ignoring the least significant address a0. Therefore, data from both memory cell arrays 10, 20 can be latched almost simultaneously at a fast timing by the data bus amplifiers 13, 23 without waiting for the results of an arithmetic circuit 46 operation.

If this operation is explained with reference to FIG. 4, first, a read command 2 and address 3 are latched by a command latch & decoder 32 and address buffer 33, respectively, based on the rise edge timing of clock 1. The upper address a9–a3 (42) is latched by an address latch circuit 38 based on the timing t1 of the address latch clock 35 generated by the command latch & decoder 32, and the lower address a2, a1 (44) is latched by an address latch & counter circuit 39. In the examplifierle given in FIG. 4, the upper address a9–a3 is "1111111" and the lower address a2, a1 is "11".

Then, these latched addresses 42, 44 are supplied as-is to the even address predecoder 21 and odd address predecoder 11. Therefore, both decoder operations end at time t3 timing, and the decoded even address 60 and odd address 58 are simultaneously supplied to the even memory cell array 20 and odd memory cell array 10, respectively. Following cell data read time $t_{readodd}$ inside the odd memory cell array, which commences at time t3, a data latch signal 551 is supplied to the odd data bus amplifier 13. Similarly, following cell data read time $t_{readeven}$ inside the even memory cell array, which commences at time t3, a data latch signal 552 is supplied to the even data bus amplifier 23. The above data latch signals 551, 552 are generated by the second clock generator 541 and the third clock generator 542 based on a fast timing signal 521.

Therefore, after a fixed time starting at time t4, both output data 14 and even output data 24 are ready to output. In this examplifierle, since an even address is supplied, the even output data 24 latched by the even data bus amplifier 23 is latched by an output data latch circuit 16 based on a first output clock 56 generated at time t5 timing, and is output to the output terminal Dout at time t6 timing. Then, following that, the odd output data 14 latched by the odd data bus amplifier 13 is latched by an output data latch circuit 26 based on a second output clock 57 generated at time t7 timing, and is output to the output terminal Dout at time t8 timing.

As is clear from comparing the timing chart to FIG. 13, in the examplifierle given in FIG. 4, the count-up operation time delay of the arithmetic circuit 46 between times t1 and t2, required in FIG. 13, does not exist. Thus, with this embodiment, the duration from time t1 to time t6 when even data is initially output, is equivalent to the duration from time t2 to time t6 in the conventional examplifierle depicted in FIG. 13. Therefore, the CAS delay time $t_{cac}$ from the clock CLK rise edge until time t6 when even data is initially output, is shorter than that of a conventional examplifierle.

FIG. 5 is a timing chart depicting the operation of the circuits of the embodiment depicted in FIG. 3 when an odd address is supplied. When an externally-supplied or internally-generated odd address is supplied, as explained with reference to the address table shown in FIG. 2, the address a1–a9 is supplied as-is to the odd address predecoder 11, and address a3–a9 and the shifted address a1, a2, which underwent a +1 arithmetic operation, are supplied to the even address predecoder 21. Then, output data of the odd memory cell array 10 is output to the output terminal Dout first, and even output data 24 is output to the output terminal Dout subsequent to that. Therefore, output data from the odd memory cell array 10 can be latched at a fast timing by an odd data bus amplifier 13 without waiting for the results of an arithmetic circuit 46 operation. Conversely, even output data is latched by an even data bus amplifier 23 at a delayed timing equivalent to the duration of the arithmetic circuit 46 operation.

If this operation is explained with reference to FIG. 5, first, a read command 2 and address 3 are latched by a command latch & decoder 32 and address buffer 33, respectively, based on the rise edge timing of clock 1. The upper address a9–a3 (42) is latched by an address latch circuit 38 based on address latch clock 35 timing t1 generated by the command latch & decoder 32, and the lower address a2, a1 (44) is latched by an address latch & counter circuit 39. In the examplifierle given in FIG. 5, the upper address a9–a3 is "11111111" and the lower address a2, a1 is "11". Up to this point, the operation is similar to that described in the case of an even address with reference to FIG. 4.

When an address a9–a1 is latched by address latch circuits 38, 39 at time t1, addresses 42, 44 are supplied to the odd address predecoder as-is, and the decoded odd address 58 is supplied to the odd memory cell array 10 following predecode time at time t2. Then, output data is latched by the odd data bus amplifier 13 based on data latch signal 551 timing generated at time t4odd subsequent to cell data read time $t_{readodd}$. This odd latched data 14 is latched by an output latch circuit 16 based on output clock 56 timing generated at time t5, and output to the output terminal Dout. Therefore, CAS delay time $t_{cac}$ does not include the time required for arithmetic circuit 46 count-up, and is thus minimized similar to when an even address is supplied as described in FIG. 4.

Meanwhile, an address a9–a3, together with a shifted address a2, a1 that underwent +1 count-up in the arithmetic circuit 46, are supplied to the even address predecoder 21. Therefore, predecoding commences subsequent to time t2 when the shifted address 48 is generated, and a decoded even address 60 is supplied to the even memory cell array 20 at time t3 after the decoded odd address 58 has been supplied to the odd side. Therefore, after that, the output data is latched by the even data bus amplifier 23 based on data latch signal 552 timing generated at time t4even subsequent to cell data read time $t_{readeven}$. This even latched data 24 is latched by an output data latch circuit 26 based on output clock 57 timing generated at time t7, and output to the output terminal Dout.

That is, the timing t4even by which the output data from the even memory cell array 20 is latched by the even data bus amplifier 23 is delayed more than the odd timing t4odd by an amount of time equivalent to the count-up operation of the arithmetic circuit 46, but since the odd output data 14 is output to the output terminal Dout first, the even output data 24 is still in time to be latched at time t7 by an output data latch 26. Therefore, the delay caused by the count-up operation in the arithmetic circuit 46 has no impact on the overall operation of outputting the even data after outputting the odd data.

In the above operation, a latch signal 552 is generated by the third clock generator 542 based on a signal 532 delayed by the delay buffer 531. This even latch signal 552 is delayed more than the odd latch signal 551, waiting the delayed timing equivalent to the duration of the count-up operation in the arithmetic circuit 46.

When an even address is supplied, as described with reference to FIG. 4 above, and when an odd address is supplied, as described with reference to FIG. 5, the CAS delay time $t_{cac}$ until the initial output data is output to the output terminal Dout is of a minimum duration, in which there are no delays brought on by arithmetic circuit 46 operation time.

Figure 6:
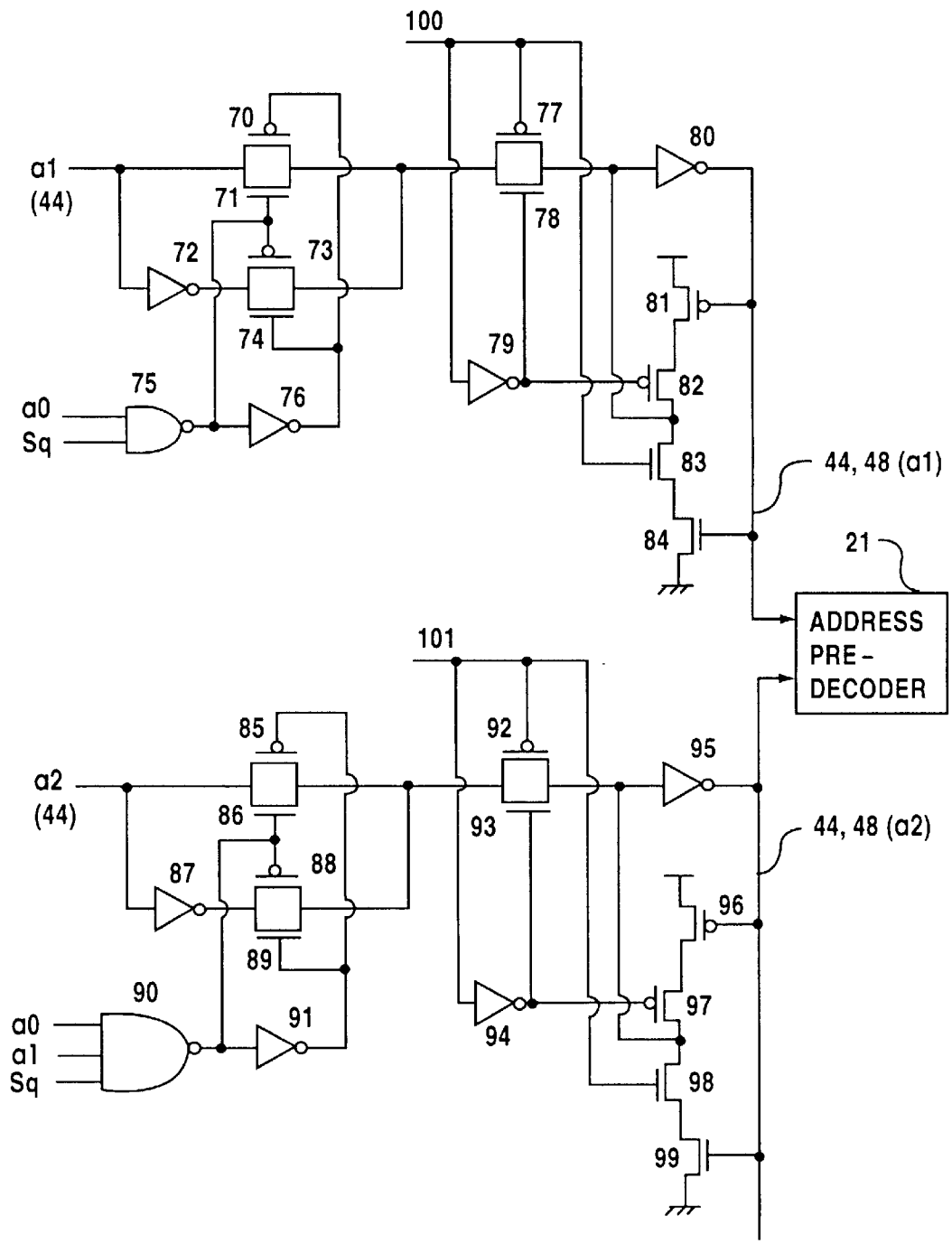
FIG. 6 depicts an example of a circuit 501, which incorporates the arithmetic circuit 46 and switch 50 depicted in FIG. 3.

FIG. 6 is a diagram depicting an examplifierle of the circuitry in an arithmetic circuit 501, which incorporates the arithmetic circuit 46 and switch 50 depicted in FIG. 3. In the diagram, the circles attached to the gates indicate p-type metal-oxide semiconductor (MOS) transistors. The upper half of the circuit depicted in FIG. 6 inputs the address a1 of the latched address 44, and generates either the address a1 of a shifted address 48 or the address a1 of the latched address 44 depending on the least significant address a0, and the bottom half of the circuit does the same for address a2.

The upper half of the circuit related to address al is explained. As explained with reference to the table shown in FIG. 2, when the address a1 supplied is an even address (a0=0), it is not changed, and is supplied as-is to the even address predecoder 21. Further, when an odd address (a0=1) is supplied, that logic is inverted and supplied to the even address predecoder 21.

Thus, in the upper half of the circuit, the complementary MOS (CMOS) switches 70, 71 close when the address is a0=0, and the CMOS switches 73, 74 close when the address is a0=1. The address a0 and a sequential mode signal square supplied to a NAND gate 75. A sequential mode signal sq is a control signal for making a burst mode operation effective. Therefore, when the sequential mode signal sq is 1 and the address a0 is 0, NAND gate 75 output is 1 (H level), CMOS switches 70, 71 are conductive and CMOS switches 73, 74 are non-conductive. Therefore, the address al is latched as-is by a latch comprising an inverter 80 and CMOS inverters 81, 84 based on latch signal 100 L level timing. That is, the latch signal 100 makes the CMOS switches 77, 78 conductive and activates the inverters 81, 84.

Conversely, when the sequential mode signal sq is 1 and the address a0 is 1, NAND gate 75 output is 0 (L level), CMOS switches 70, 71 are non-conductive, and switches 73, 74 are conductive. Therefore, the address al is inverted by an inverter 72, and latched by the above latch using an L level latch signal 100.

As described above, the address a1 is either generated as a signal 44 as-is, or as an inverted shifted address 48, depending on the least significant address a0.

Next, the lower half of the circuit related to address a2 is explained. As explained with reference to the table in FIG. 2, when the lower address a0, a1 is (1, 1), the address a2 is an inverted logical value because of a carry operation, and when the lower address a0, a1 is other than (1, 1), a carry operation is not performed, and the address a2 is a logical value as-is.

Thus, when the sequential mode signal sq is 1, and the lower address a0, a1 is other than (1, 1), NAND gate 90 output is 1 (H level). As a result of this, CMOS switches 85, 86 are conductive, and the address a2 is latched as-is by a latch comprising an inverter 95 and CMOS inverters 96, 99 based on latch signal 101 L level timing.

Conversely, when the sequential mode signal sq is 1 and the lower address a0, a1 is (1, 1), NAND gate 90 output is 0 (L level). As a result, CMOS switches 88, 89 are conductive, and the address a2 is converted to an inverted logical value by an inverter 87, and latched by a latch comprising an inverter 95 and CMOS inverters 96, 99 based on latch signal 100 L level timing.

As described above, the address a2 is either generated as a signal 44 as-is, or as an inverted shifted address 48, depending on the lower address a0, a1 combination.

Figure 7:
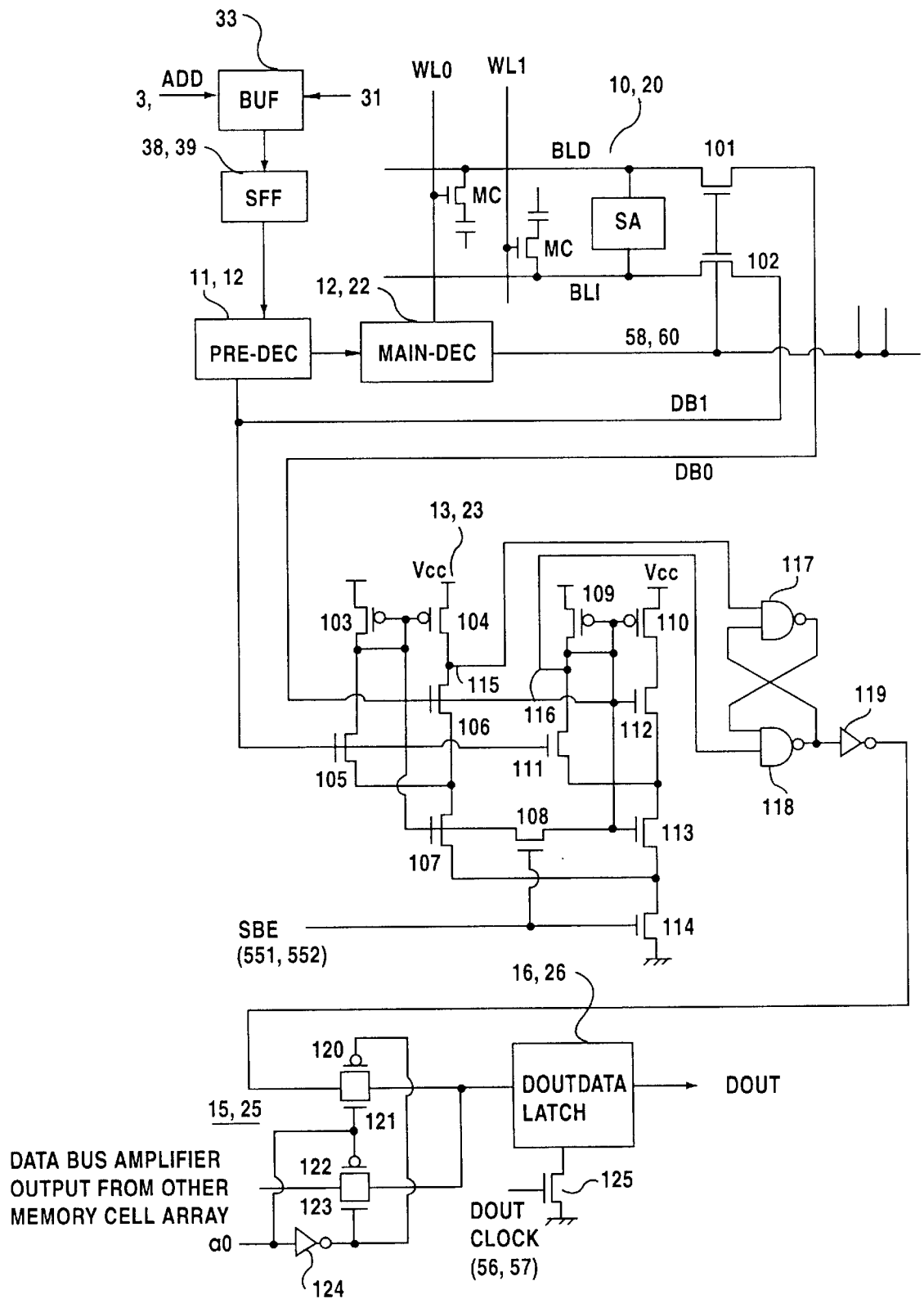
FIG. 7 depicts an entire semiconductor memory device, which indicates in particular the relationship between the data bus amplifiers and output data latch circuits in this embodiment.

FIG. 7 is a block diagram depicting an entire semiconductor memory device, showing the relationship between the data bus amplifiers and output data latches of this embodiment in particular. The same reference numbers are attached to those parts which correspond to the circuit depicted in FIG. 3.

In FIG. 7, an external address 3 is introduced into an address buffer 33 based on clock 31 timing, and supplied to predecoders 11, 21 via latch circuits 38, 39. The circuit 501 depicted in FIG. 3 is omitted from this examplifierle. Further, the external address 3 is a column address. The outputs from the predecoders 11, 21 are output to address main decoders 12, 22, and decoded selection signals 58, 60 are supplied to memory cell arrays 10, 20.

Inside the memory cell arrays 10, 20, memory cells MC are positioned where a plurality of word lines WL0, WL1 and bit lines BL0, BL1 intersect with one another. A row address, not shown in the diagram, is decoded, a nd a selected word line WL rises. As a result, the potential of a bit line BL fluctuates in accordance with a charge stored in memory cell MC capacitance. Then, the differential signals of bit lines BL0, BL1 are detected and amplified by a sense amplifier SA. Selection signals 58, 60 from the main decoders 12, 22 cause the bit line transfer gates 101, 102 to conduct, and output data amplified by the sense amplifier SA are output to data buss lines DB0, DB1. Then, the output data output to these data buss lines DB0, DB1 is amplified and latched by data bus amplifiers 13, 23 based on the timing of data latch signals 551, 552.

The data bus amplifiers 13, 23, which are data-hold circuits, are configured by two differential amplifiers including current mirror circuits 103, 104 and 109, 110, and latch circuit formed by NAND gates 117, 118, which latch the outputs 115, 116 of these differential amplifiers.

The data buss lines DB0, DB1 are supplied to n-type transistors 105, 106 and 111, 112, which are connected to common sources. Thus, when data latch signals 551, 552 turn transistors 114 and 108 ON and activate the differential amplifiers, either one of transistors 105 or 106 turns ON, or either one of transistors 111 or 112 turns ON. As a result, a reverse phase signal is generated to the outputs 115 and 116 of the respective differential amplifiers, and this reverse phase signal is latched by a latch comprising two cross-connected NAND gates 117, 118.

The output from this latch is inverted by an inverter 119, and supplied to output data latch circuits 16, 26 by switches 15, 25. The switches 15, 25 are comprised of CMOS switches 120, 121 and 122, 123, and are selectively closed or opened by the least significant address a0. Data bus amplifier output signals from the other memory cell array are supplied to the switches 122, 123. As explained with reference to FIG. 3, in accordance with the logic of the least significant address a0, even or odd output data are latched by output data latch circuits 16, 26 on the basis of output clock 56, 57 H level timing by turning a transistor 125 ON.

The above describes the flow of read data from the memory cell arrays 10, 20 to the output terminal Dout.

[Second Embodiment]

In the above-described embodiment depicted in FIG. 3, a +1 operation was performed by the arithmetic circuit 46 relative to lower addresses a2, a1. However, as explained with reference to the table in FIG. 2, a SDRAM can form odd addresses and even addresses for just eight types of supplied addresses. Therefore, instead of a general-purpose +1 arithmetic circuit, by fabricating a circuit that converts eight kinds of combinations of addresses a0, a1, a2 to odd and even addresses, CAS delay time can be shortened whether the supplied address is odd or even.

Figure 8A:
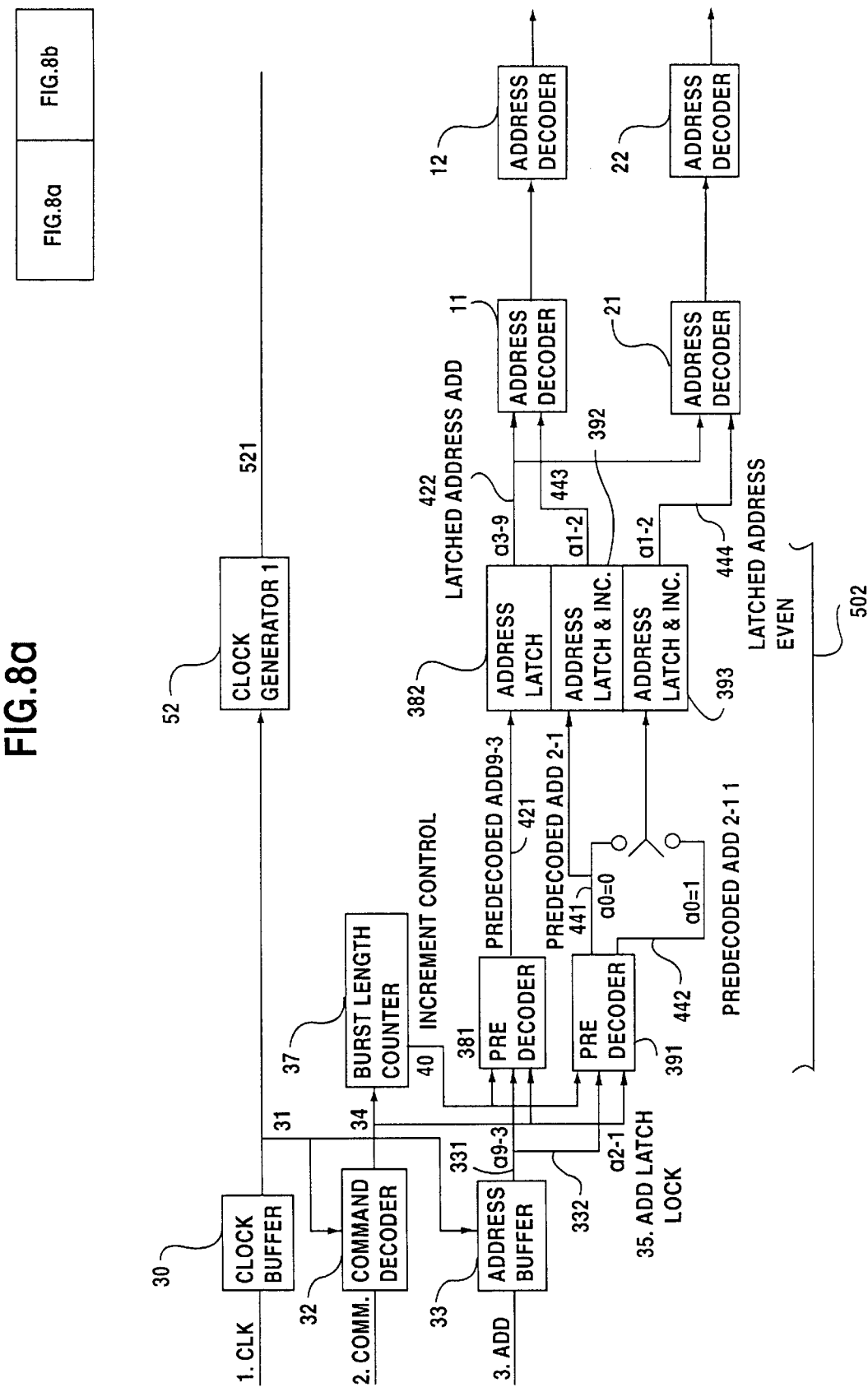
FIG. 8 depicts the circuitry of a second embodiment.
Figure 8B:
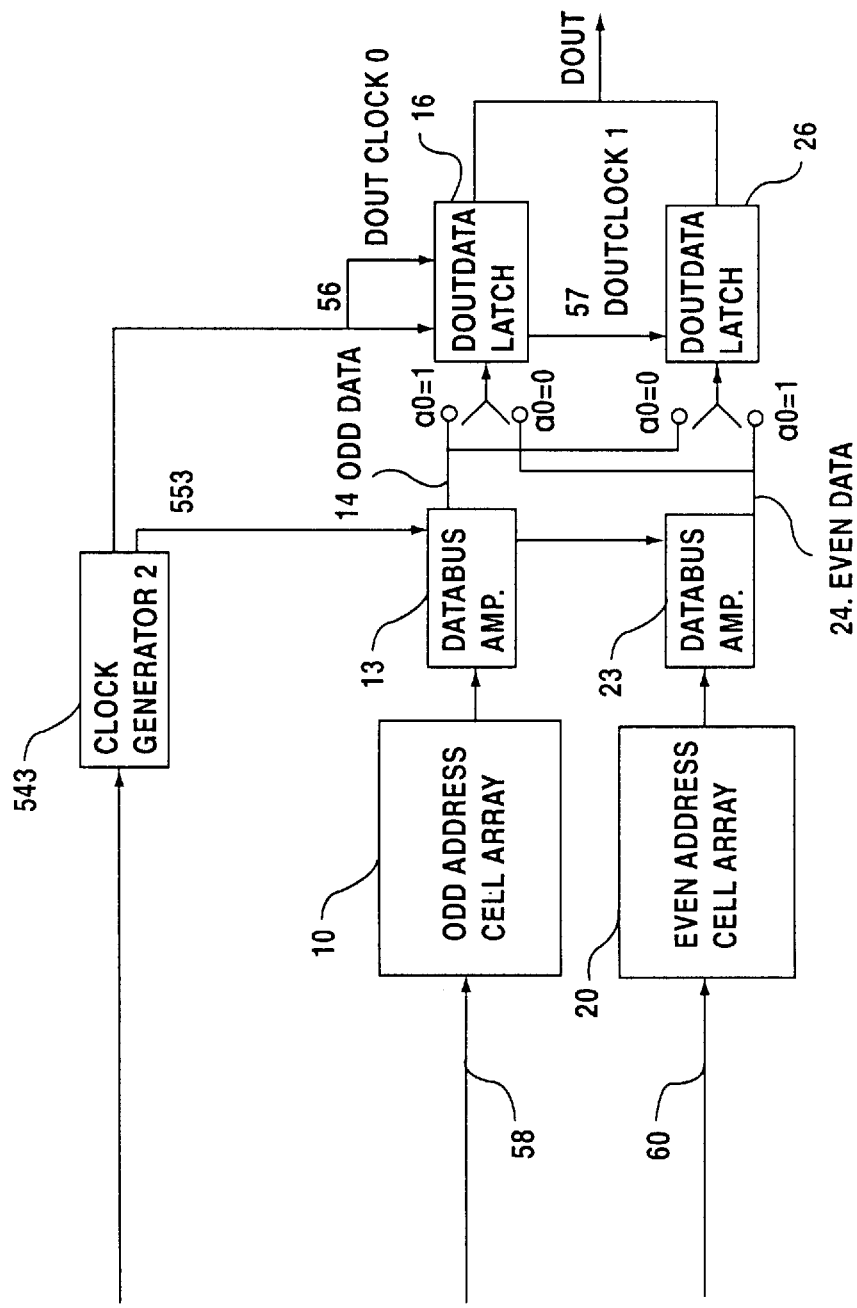

FIG. 8 is a block diagram depicting the circuitry of a second embodiment. The second embodiment is equipped with such a conversion circuit 502, and the data bus amplifier latch signal 553 is generated at the same fast timing whether the address is even or odd. The odd and even latch signal 553 is generated by the same clock generator 543, but unlike the conventional examplifierle depicted in FIG. 13, the latch signal 553 is generated based on fast timing.

The circuitry depicted in FIG. 8 differs from the first embodiment depicted in FIG. 3 in that it is equipped with a conversion circuit 502, which performs conversion operations relative to lower addresses a1, a2 in accordance with the logic of least significant address a0, and in that the same data latch signal 553 is generated by a clock generator 543 and supplied to odd and even data bus amplifiers 13, 23. As a rule, when the least significant address is a0=0 (even address), this conversion circuit 502 supplies the same address a1, a2 as-is to the odd and even decoders 11, 21, and when the least significant address is a0=1 (odd address), it supplies a2, a1 as-is to the odd decoder 11, and converts this address from (0, 0) to (0, 1), from (0, 1) to (1, 0), from (1, 0) to (1, 1) and from (1, 1) to (0, 0), respectively and supplies the converted address to the even decoder 21. That is, this conversion is possible by replacing four kinds of address a2, a1 combinations with different combinations, each of which was shifted one position. In particular, the conversion circuit 502 in this embodiment predecodes the address a2, a1, and shift converts four kinds of predecoding signals in accordance with least significant address a0 logic.

First, the upper address a9–a3 is latched by an address buffer 33 based on clock 31 timing, and supplied to a predecoder 381. Then, an appropriately predecoded signal 421 is latched once by an address latch circuit 382. This latched predecoded signal 422 is supplied to the odd and even address decoders 11, 21.

The lower address a2, a1 is supplied to a predecoder 391 on the basis of latch clock 35 timing, and a 4-bit first predecoded signal 441 and a second predecoded signal 442, which shift-converts the first predecoded signal, are generated. The first predecoded signal 441 is supplied to an odd address latch & counter 392. And the first predecoded signal 441 or the second predecoded signal 442 is selected in accordance with the logic of the least significant address a0 and supplied to an even address latch & counter 393.

Then, a predecoded signal 443 from the odd address latch & counter 392 is supplied to the odd address decoder 11, and a predecoded signal 444 from the even address latch & counter 393 is supplied to the even address decoder 21.

Then, column output data selected in accordance with an odd decoded signal 58 is latched by an odd data bus amplifier 13 based on the data latch signal 553 timing. And similarly, column output data selected in accordance with an even decoded signal 60 is latched by an even data bus amplifier 23 based on the data latch signal 553 timing. Both data bus amplifiers 13, 23 latch these data based on the same data latch signal 553. Moreover, since the operation of the conversion circuit 502 does not require carry and other complicated operations like an arithmetic circuit, shift-converted predecoded signals 441, 442 can be generated without delay time. Therefore, the data latch signal 553 is a fast timing signal, which does not incorporate the count-up delay time required with an arithmetic circuit.

Figure 9B:
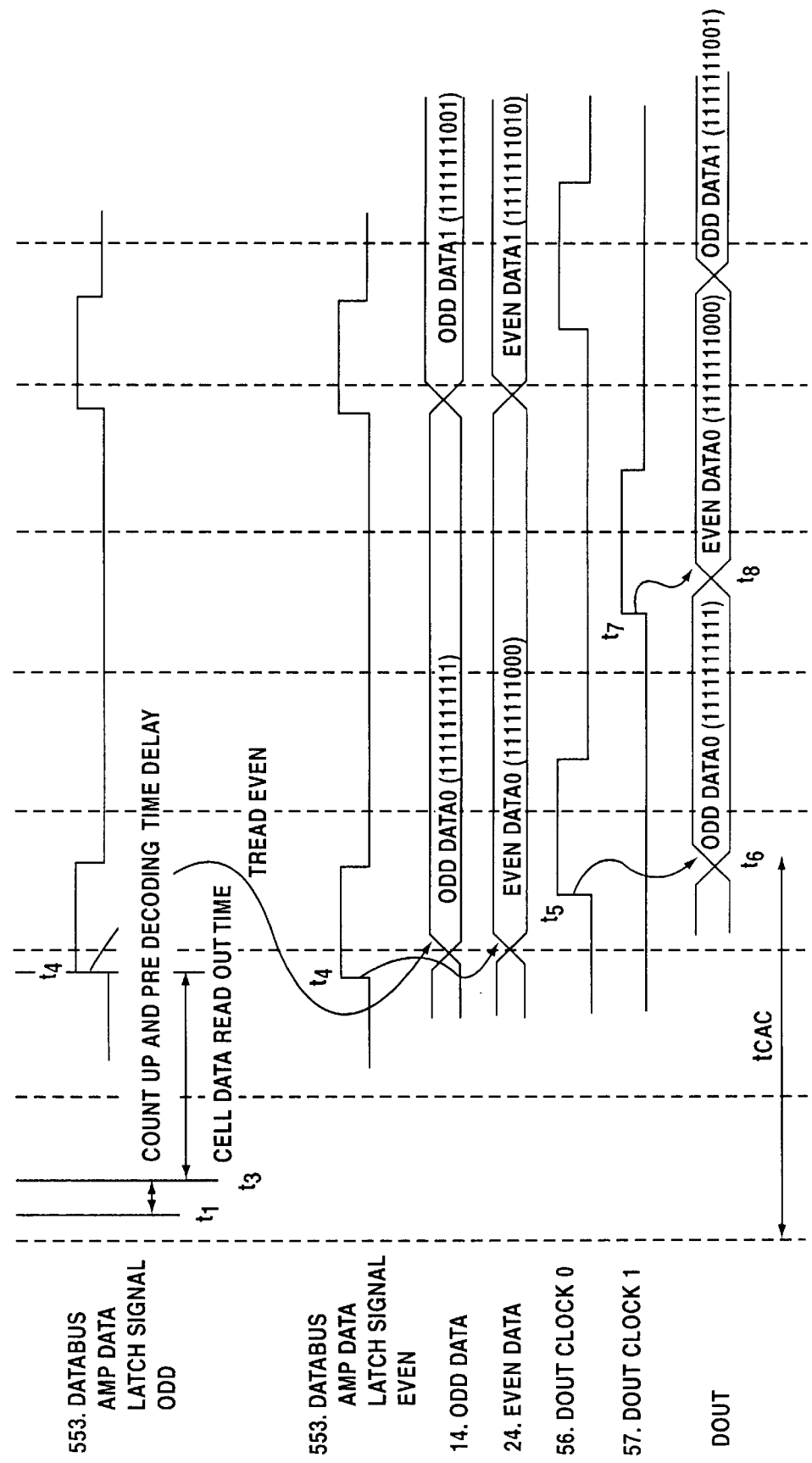
FIG. 9 depicts a timing chart for explaining the operation depicted in FIG. 8.

FIG. 9 depicts a timing chart explaining the operations described with reference to FIG. 8. As described above, in synchronous with the clock 1 rise edge, a read command 2 and external address 3 are latched by buffers 32, 33, respectively. Then, between time t1 when these latches were completed and time t3, the upper address a9–a3 is predecoded by a predecoder 381, latched by an address latch circuit 382, and further decoded by address decoders 11, 12 and 21, 22, and decoded signals 58, 60 are generated.

Further, between time t1 and time t2, the lower address a2, a1 is predecoded by the conversion circuit 502, shift-converted depending on the logic of the least significant address a0, and decoded by address decoders 11, 12 and 21, 22, and decoded signals 58, 60 are generated. Shift conversion by the logic of the least significant address a0, as is explained later, does not require a special circuit configuration, but rather, simply shifting the predecoded signal connection 1 bit, without generating delay time like an arithmetic circuit.

Then, at time t4 subsequent to cell data read times $t_{readodd}$, $t_{readeven}$ from time 3, on the basis of data latch signal 553 timing, output data from the odd memory cell array 10 is latched by the odd data bus amplifier 13, and output data from the even memory cell array 20 is latched by the even data bus amplifier 23. After that, since the external address in the example depicted in FIG. 9 is odd, odd output data 14 is latched and output by an output data latch circuit 16 based on the timing t5 of an output clock 56, following which, even output data 24 is latched and output by an output data latch circuit 26 based on the timing t7 of an output clock 57. Therefore, the CAS delay time $t_{cac}$, from the rise of clock 1, by which the read command was introduced, until the initial output data was output is shorter than the conventional examplifierle by an amount of time equivalent to an arithmetic operation.

Figure 10:
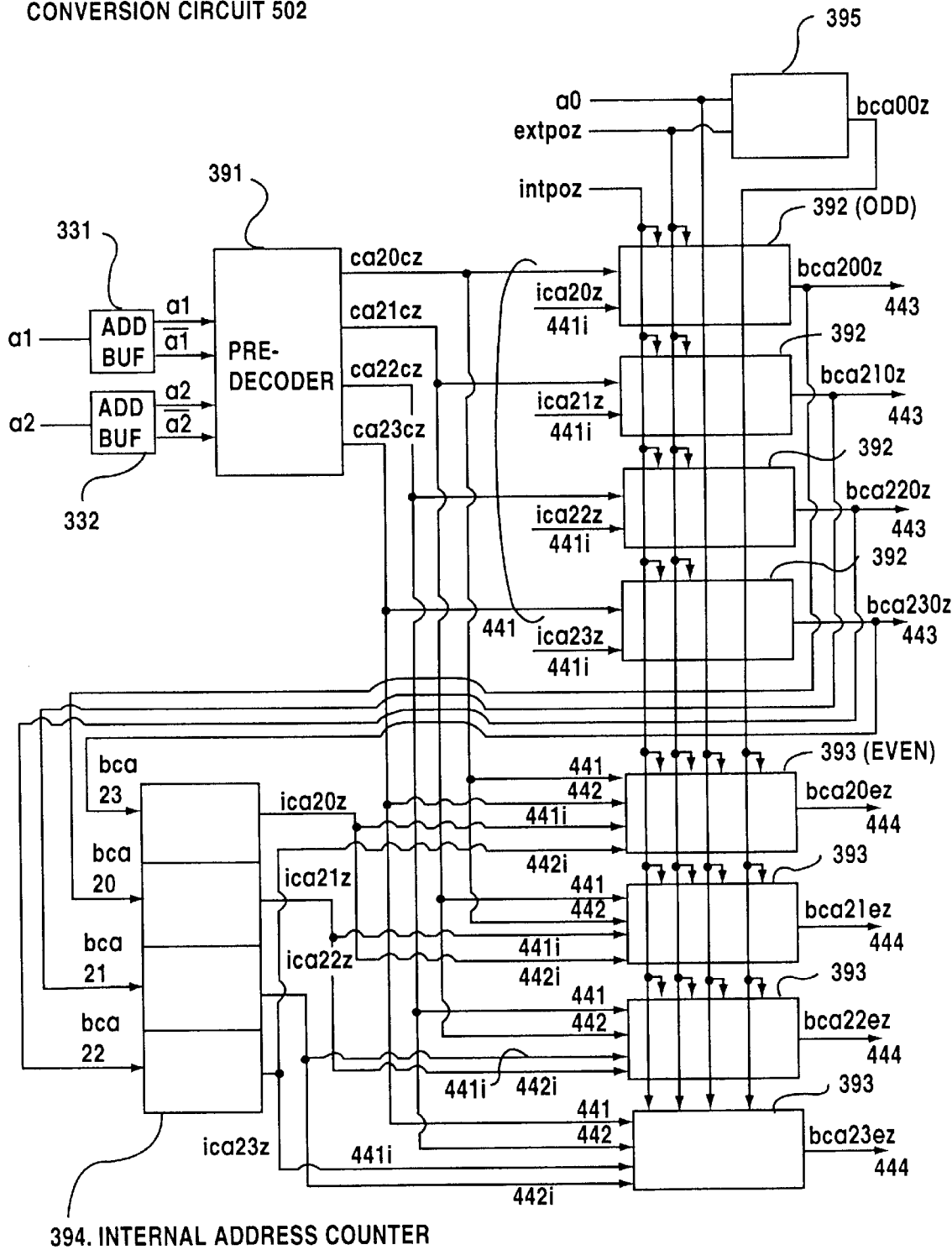
FIG. 10 depicts a simplified version of the conversion circuit 502 depicted in FIG. 8.

FIG. 10 is a block diagram depicting a simplified version of the conversion circuit 502 described in reference with FIG. 8. The same reference numbers are attached to those parts that correspond with parts depicted in FIG. 8. With this conversion circuit, addresses a2, a1 are latched by address buffers 331, 332, and reverse phase signals a1, /a1, a2, /a2 are generated. These reverse phase signals are supplied to a predecoder 391, and a 4-bit predecoded signal 441 is generated. In the diagram, the numbers ca20cz, ca21cz, ca22cz and ca23cz are applied to this 4-bit predecoded signal 441. These predecoded signals 441 are supplied as-is to an odd address latch 392. And an internal predecoded signal 441*i* counted up from an internal address counter 394 is supplied to the odd address latch 392. Then, the predecoded signal 441 or the internal predecoded signal 441*i* are selected by an external address activation signal extp0z and an internal address activation signal intp0z. Therefore, when a 4-bit or 8-bit burst mode command signal is supplied, internal address activation intp0z is activated on the basis of prescribed timing.

The burst mode has burst lengths of 2-bits, 4-bits and 8-bits. Therefore, in the case of a 4-bit or 8-bit burst length, it is necessary to count up the addresses a2, a1, a0 internally. When this happens, the predecoded signal 441*i*, which was counted up by an internal address counter 394, is selected by the internal address activation signal intp0z.

This internal address counter 394 generates as the internal predecoded signal 441*i* a signal which shifts by 1 bit predecoded signal 443. Therefore, signals bca20z, bca21z, bca22z and bca23z are supplied to the internal address counter 394 by shifting them 1 bit. In the internal address counter, this input predecoded signal 443 is latched by a latch that will be described later.

The first predecoded signal 441 of a predecoder 391, and a second predecoded signal 442, which shifts the first predecoded signal 441 by 1 bit, are supplied to an even address latch 393. The second predecoded signal 442 is connected to the address latch 393 by simply shifting the wiring 1 bit. Further, the first internal predecoded signal 441*i* counted up in the internal address counter 394, and a second internal predecoded signal 442*i*, which shifts the first internal signal 441*i* by 1 bit, are supplied to the even address latch 393. The second predecoded signal 442*i* is connected to the address latch 393 by simply shifting the wiring 1 bit.

Thus, the selection of predecoded signals 441, 442 or internal predecoded signals 441*i*, 442*i* is performed by the above-mentioned external address activation signal extp0z or internal address activation signal intp0z. In addition, the selection of the first predecoded signals 441, 441*i* or second predecoded signals 442, 442*i* is performed by the least significant address a0, or a delay signal bca00z, which delays the least significant address in a delay circuit 395.

That is, in accordance with burst length, predecoded signals 441, 442 generated from an external address are selected by an external address activation signal extp0z, and internal predecoded signals 441*i*, 442*i* generated from an internal address counter 394 are selected by an internal address activation signal intp0z. Similarly, when the least significant address is a0=0, the first predecoded signals 441, 441*i* are selected, and when the least significant address is a0=1, the 1-bit-shifted second predecoded signals 442, 442*i* are selected.

As gleaned from FIG. 10, since 1-bit-shifted second predecoded signals 442, 442*i* can be formed by simply shifting that wiring, there is no particular need for arithmetic circuits for 1-bit shifts. Therefore, no special delay time is required for conversion that shifts 1 bit.

Figure 11A:
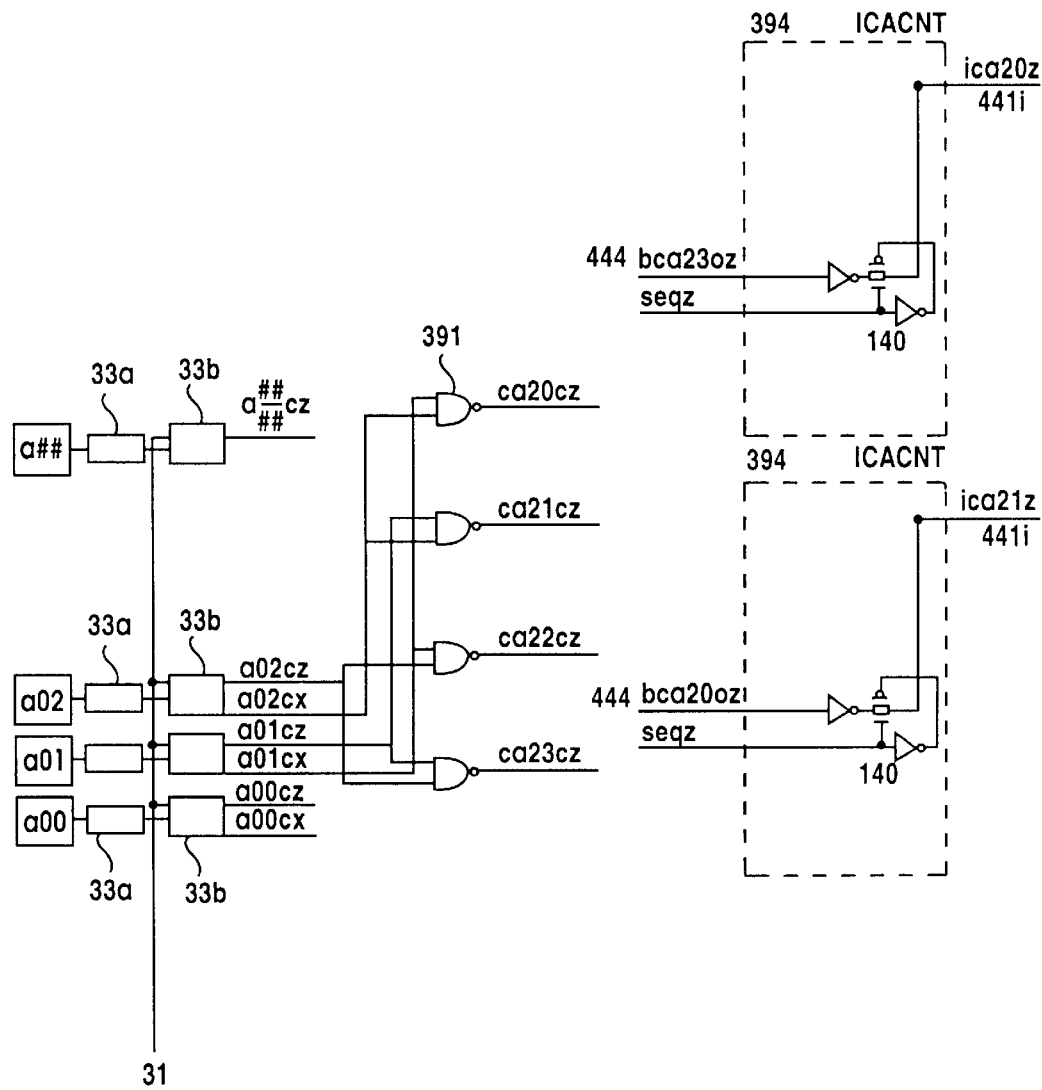
FIG. 11 depicts the inside of each of the circuits 391, 392, 393, 394 depicted in FIG. 10 (Part 1)
Figure 11B:
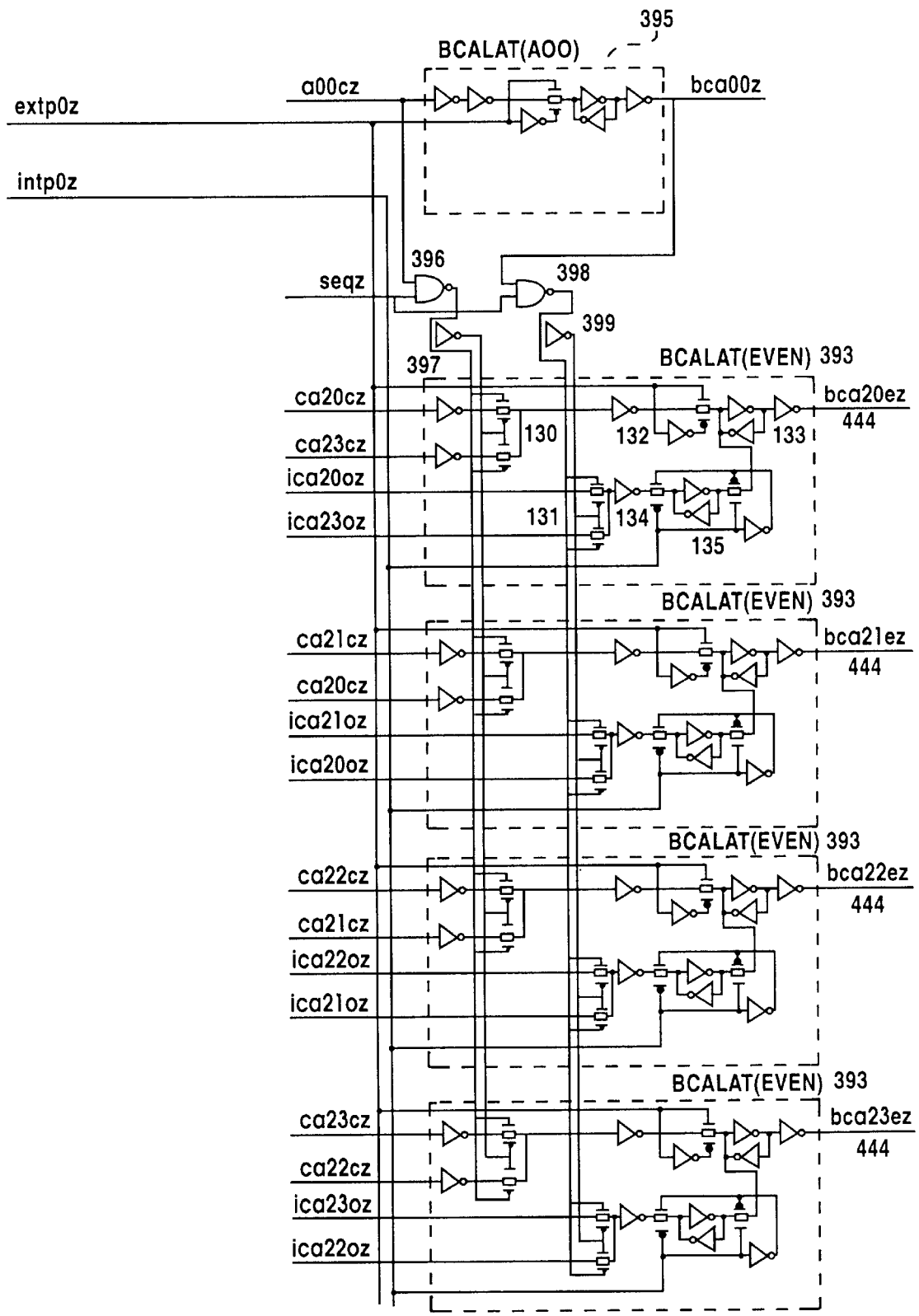
Figure 12:
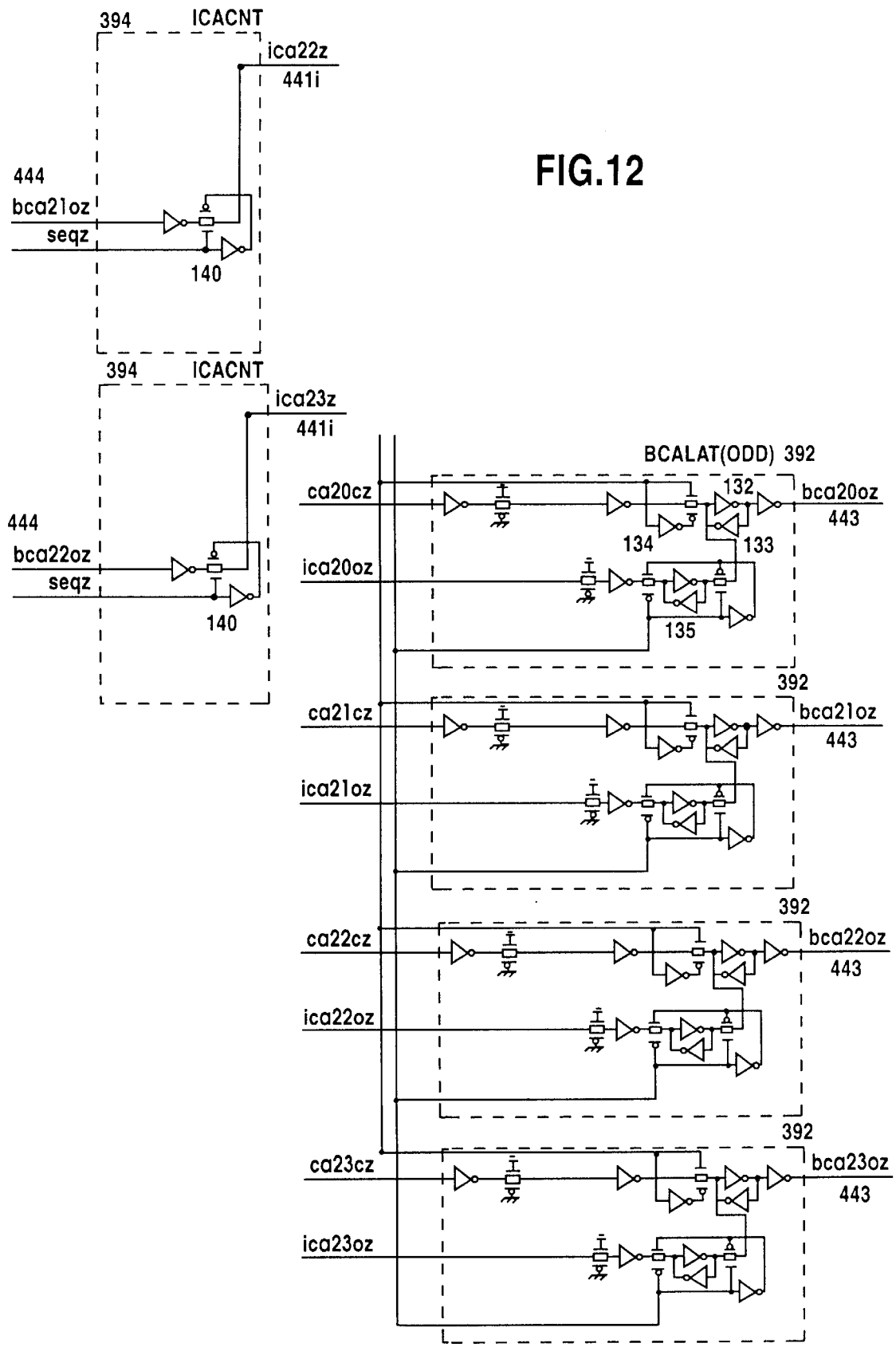
FIG. 12 depicts the inside of each of the circuits 391, 392, 393, 394 depicted in FIG. 10 (Part 2)

FIGS. 11 and 12 are diagrams depicting the insides of each of the circuits 391, 392, 393, 394 depicted in FIG. 10. Portions of circuits 393 and 394 are duplicated in FIGS. 11 and 12, and FIG. 10 can be completed by joining the two diagrams together. The address buffer 33 is configured from a differential amplifier 33*a*, which utilizes a csynchronousronized it, and a synchronousronized flip-flop 33*b*, which is latched by a clock 31. The predecoder 391 comprises four NAND gates, to which output combinations from the address buffer 33 are input. The internal address counter 394 is configured so that a CMOS switch 140 is controlled by a sequential mode signal seqz.

The even address latch 393 comprises a CMOS switch 130, which is closed and opened by the least significant address a0, and a CMOS switch 131, which is closed and opened by a delayed least significant address bca00z. These switches select first or second predecoded signals in accordance with address a0 logic as described above. The even address latch 393 further comprises a CMOS switch 132, which is closed by an external address activation signal extp0z, and a latch circuit 133, which latches predecoded signals 441, 442. It further comprises a CMOS switch 134, which is closed by an internal address activation signal intp0z, and a latch 135, which latches internal predecoded signals 441*i*, 442*i*.

The odd address latch 392 comprises a CMOS switch 132, which is closed by an external address activation signal extp0z, and a latch 133, which latches predecoded signals 441, 442, and further comprises a CMOS switch 134, which is closed by an internal address activation signal intp0z, and a latch 135, which latches internal predecoded signals 441*i*, 442*i*. These configurations are the same as those for the even address latch 393. The odd address latch 392 is not equipped with a switch 130, 131 for selecting first or second predecoded signals in accordance with the least significant address a0 like the even side.

In the second embodiment described above, the signal, which predecoded the address a1, a2, was shifted 1 bit. However, the address a1, a2 can be supplied to the predecoder 391 by shifting the output combinations (four kinds) from the address buffer 33 which took it in. Then, the first and second predecoded signals are generated. But in this case, an internal address counter must count up the supplied addresses. Therefore, an internal address counter configuration can be achieved simply by creating a circuit architecture, which shifts by 1 bit signals predecoded by a predecoder 391.

As explained above, according to the present invention, the timing by which the initial output data in a 2-bit pre-fetch circuit is generated to the output terminal Dout can be speeded up whether an even address is supplied or an odd address is supplied. Therefore, it is possible to shorten the CAS delay time $t_{cac}$ cited on specifications.

Further, in a 2-bit pre-fetch circuit, by converting the lower addresses a1, a2 of a column address to a first address, which is output first, and a second address, which is output second, it is possible to supply the appropriate addresses to the decoder without performing a +1 arithmetic operation, and to speed up the timing by which output data is generated to the output terminal Dout.

In this case, by selecting, the signal, which predecoded the lower addresses a1, a2, or a signal, which shifts this predecoded signal by 1 bit, in accordance with the logic of the least significant address a0, it is possible to simplify the circuit architecture, and to shorten the CAS delay time $t_{cac}$ on specifications.

What is claimed is:

1. A semiconductor memory device having a 2-bit pre-fetch function, which sequentially outputs first data of a memory cell that corresponds to an externally-supplied or internally-generated first column address, and a second data of a memory cell that corresponds to a second column address, which increments said first column address, comprising:

an odd memory cell array, comprising memory cells that correspond to odd column addresses;

an odd column address decoder that corresponds to said odd memory cell array;

an odd data-hold circuit for holding read data from said odd memory cell array;

an even memory cell array, comprising memory cells that correspond to even column addresses;

an even column address decoder that corresponds to said even memory cell array; and an even data-hold circuit for holding read data from said even memory cell array;

wherein when the least significant bit in said first column address is odd, hold timing of said odd data-hold circuit is faster than hold timing of said even data-hold circuit.

2. The semiconductor memory device according to claim 1, wherein when the least significant bit in said first column address is even, said even data-hold circuit hold timing is roughly the same as said odd data-hold circuit hold timing.

3. The semiconductor memory device according to claims 1 or 2, comprises an arithmetic circuit, which supplies the second and third lower bits of said first column address as-is to said odd address decoder, and, when said least significant bit is even, supplies said second and third lower bits as-is to said even address decoder, and when said least significant bit is odd, increments said second and third lower bits and supplies the incremented lower bits to said even address decoder.

4. The semiconductor memory device according to claims 1 or 2, further comprising a data latch signal generator for generating odd data latch signals supplying said odd data-hold circuit hold timing, and even data latch signals supplying said even data-hold circuit hold timing.

5. The semiconductor memory device according to claims 1 or 2, wherein said odd data-hold circuit comprises an odd data bus amplifier for holding output data output from said odd memory cell array to a data bus;

and said even data-hold circuit comprises an even data bus amplifier for holding output data output from said even memory cell array to the data bus.

6. The semiconductor memory device according to claim 5, further comprising:

a first output latch circuit for latching, at a first clock, output data held by said even data-hold circuit when said least significant bit is even, and output data held by said odd data-hold circuit when said least significant bit is odd, respectively; and a second output latch circuit for latching, at a second clock slower than the first clock, output data held by said odd data-hold circuit when said least significant bit is even, and output data held by said even data-hold circuit when said least significant bit is odd, respectively.

7. A semiconductor memory device having a 2-bit prefetch function, which sequentially outputs first data of a memory cell that corresponds to an externally-supplied or internally-generated first column address, and a second data of a memory cell that corresponds to a second column address which increments said first column address, comprising:

an odd memory cell array, comprising memory cells that correspond to odd column addresses;

an odd column address decoder that corresponds to said odd memory cell array;

an odd data-hold circuit for holding read data from said odd memory cell array;

an odd even memory cell array, comprising memory cells that correspond to even column addresses;

an even column address decoder that corresponds to said even memory cell array;

an even data-hold circuit for holding read data from said even memory cell array;

a predecoder for predecoding at least the two lower bits of said first column address;

an odd address latch circuit for latching said predecoded signal and supplying the predecoded signal to said odd decoder; and an even address latch circuit for latching a predecoded first signal when said first column address is even, for latching second signal, which predecodes an address incremented at least said two lower bits when said first column address is odd, and for supplying said first or second signals to said even decoder.

8. The semiconductor memory device according to claim 7, wherein when said first column address is odd, said even address latch circuit latches a second signal that shifts said first signal.

9. The semiconductor memory device according to claims 7 or 8, wherein hold timing of said even data-hold circuit is roughly the same as hold timing of said odd data-hold circuit regardless of whether said first column address is even or odd.

10. The semiconductor memory device according to claim 7, wherein said odd data-hold circuit comprises an odd data bus amplifier for holding output data output from said odd memory cell array to a data bus; and said even data-hold circuit comprises an even data bus amplifier for holding output data output from said even memory cell array to the data bus.

11. The semiconductor memory device according to claim 10, further comprising:

a first output latch circuit for latching, at a first clock, output data held by said even data-hold circuit when said first column address is even, and output data held by said odd data-hold circuit when said first column address is odd, respectively; and a second output latch circuit for latching, at a second clock slower than the first clock, output data held by said odd data-hold circuit when said first column address is even, and output data held by said even data-hold circuit when said first column address is odd, respectively.

12. A semiconductor memory device having a 2-bit prefetch function, which sequentially outputs first data of a memory cell that corresponds to an externally-supplied or internally-generated first column address, and a second data of a memory cell that corresponds to a second column address which increments said first column address, comprising:

an odd memory cell array, comprising memory cells that correspond to odd column addresses;

an odd column address decoder that corresponds to said odd memory cell array;

an odd data-hold circuit for holding read data from said odd memory cell array;

an even memory cell array, comprising memory cells that correspond to even column addresses;

an even column address decoder that corresponds to said even memory cell array;

an even data-hold circuit for holding read data from said even memory cell array;

an address latch including an odd address latch circuit for latching a first signal predecoded at least the lower two bits of said first column address, and for supplying the first signal to said odd decoder; and an even address latch circuit for latching said first signal when said first column address is even, for latching a second signal shifted from said first signal said first column address is odd, and for supplying said first or second signals to said even decoder.

13. The semiconductor memory device according to claim 12, wherein said address latch further comprises an internal address counter for generating a first internal signal shifted the output of said odd address latch circuit; and said first internal signal is latched by said odd address latch circuit, and said first internal signal or a second internal signal shifted said first internal signal is latched by said even address latch circuit, in accordance with a burst mode signal.

* * * * *